United States Patent
van Dal et al.

(10) Patent No.: US 9,472,468 B2
(45) Date of Patent: Oct. 18, 2016

(54) NANOWIRE CMOS STRUCTURE AND FORMATION METHODS

(71) Applicant: Taiwan Semiconductor Manufacturing Company, Ltd., Hsin-Chu (TW)

(72) Inventors: Mark van Dal, Linden (BE); Aryan Afzalian, Chastre (BE); Gerben Doornbos, Leuven (BE)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/567,252

(22) Filed: Dec. 11, 2014

(65) Prior Publication Data

US 2016/0172246 A1    Jun. 16, 2016

(51) Int. Cl.
| | |
|---|---|
| *H01L 21/8258* | (2006.01) |
| *H01L 29/66* | (2006.01) |
| *H01L 29/06* | (2006.01) |
| *H01L 21/308* | (2006.01) |
| *H01L 21/311* | (2006.01) |
| *H01L 21/02* | (2006.01) |
| *H01L 29/423* | (2006.01) |

(52) U.S. Cl.
CPC ..... *H01L 21/8258* (2013.01); *H01L 21/02381* (2013.01); *H01L 21/02532* (2013.01); *H01L 21/02538* (2013.01); *H01L 21/308* (2013.01); *H01L 21/31111* (2013.01); *H01L 29/0676* (2013.01); *H01L 29/42392* (2013.01); *H01L 29/66545* (2013.01); *H01L 29/66666* (2013.01)

(58) Field of Classification Search
None
See application file for complete search history.

(56) References Cited

U.S. PATENT DOCUMENTS

| | | | |
|---|---|---|---|
| 2006/0021564 A1* | 2/2006 | Norman | C30B 29/605 117/84 |
| 2007/0232007 A1* | 10/2007 | Forbes | H01L 29/0665 438/301 |
| 2007/0286945 A1* | 12/2007 | Lahnor | H01L 28/40 427/80 |
| 2011/0012085 A1* | 1/2011 | Deligianni | H01L 29/0665 257/9 |
| 2011/0253981 A1* | 10/2011 | Rooyackers | H01L 29/0665 257/24 |

OTHER PUBLICATIONS

Kuhn, Kelin J., "Considerations for Ultimate CMOS Scaling," IEEE Transactions on Electron Devices, vol. 59, No. 7, Jul. 2012; pp. 1813-1828.

Naji, K. et al., "Growth of vertical and defect free InP nanowires on SrTiO3(001) substrate and comparison with growth on silicon," www.elsevier.com/locate/jcrysgro, Journal of Crystal Growth 343(2012), Dec. 27, 2011, pp. 101-104.

* cited by examiner

*Primary Examiner* — Michelle Mandala
(74) *Attorney, Agent, or Firm* — Slater Matsil, LLP

(57) ABSTRACT

A method includes growing a nanowire from a substrate, forming a sacrificial layer surrounding the nanowire, removing the nanowire from the sacrificial layer to form an opening in the sacrificial layer, and growing a replacement semiconductor nanowire in the opening.

20 Claims, 40 Drawing Sheets

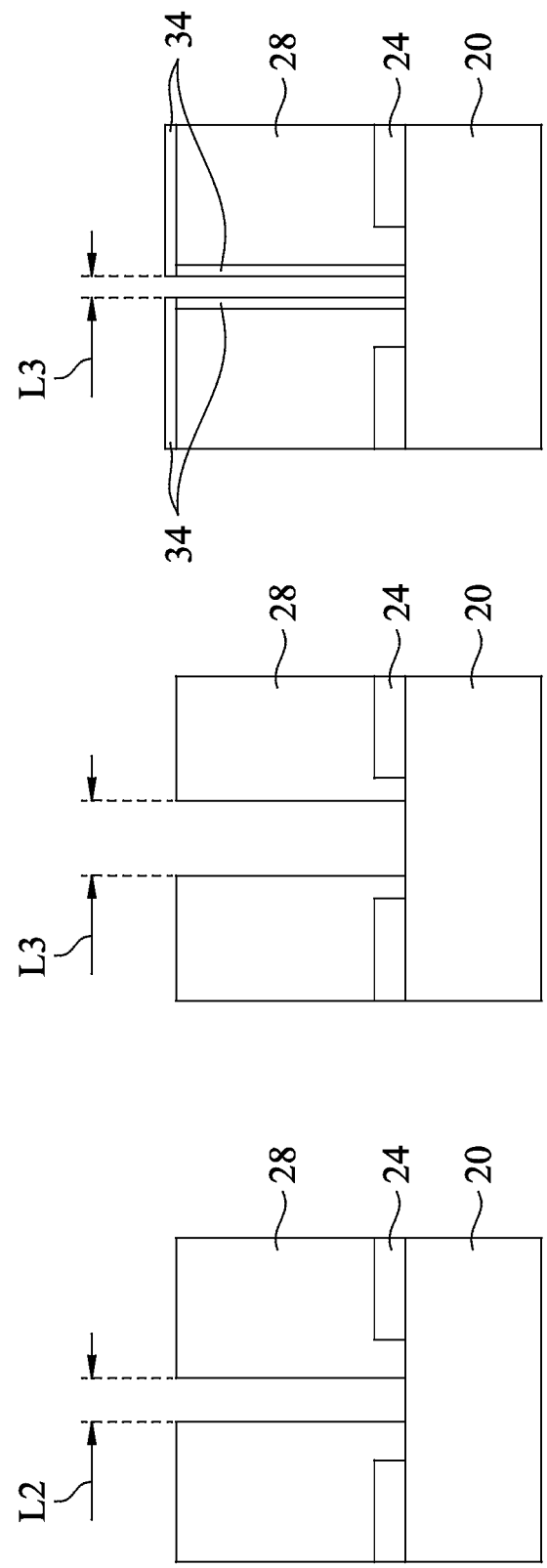

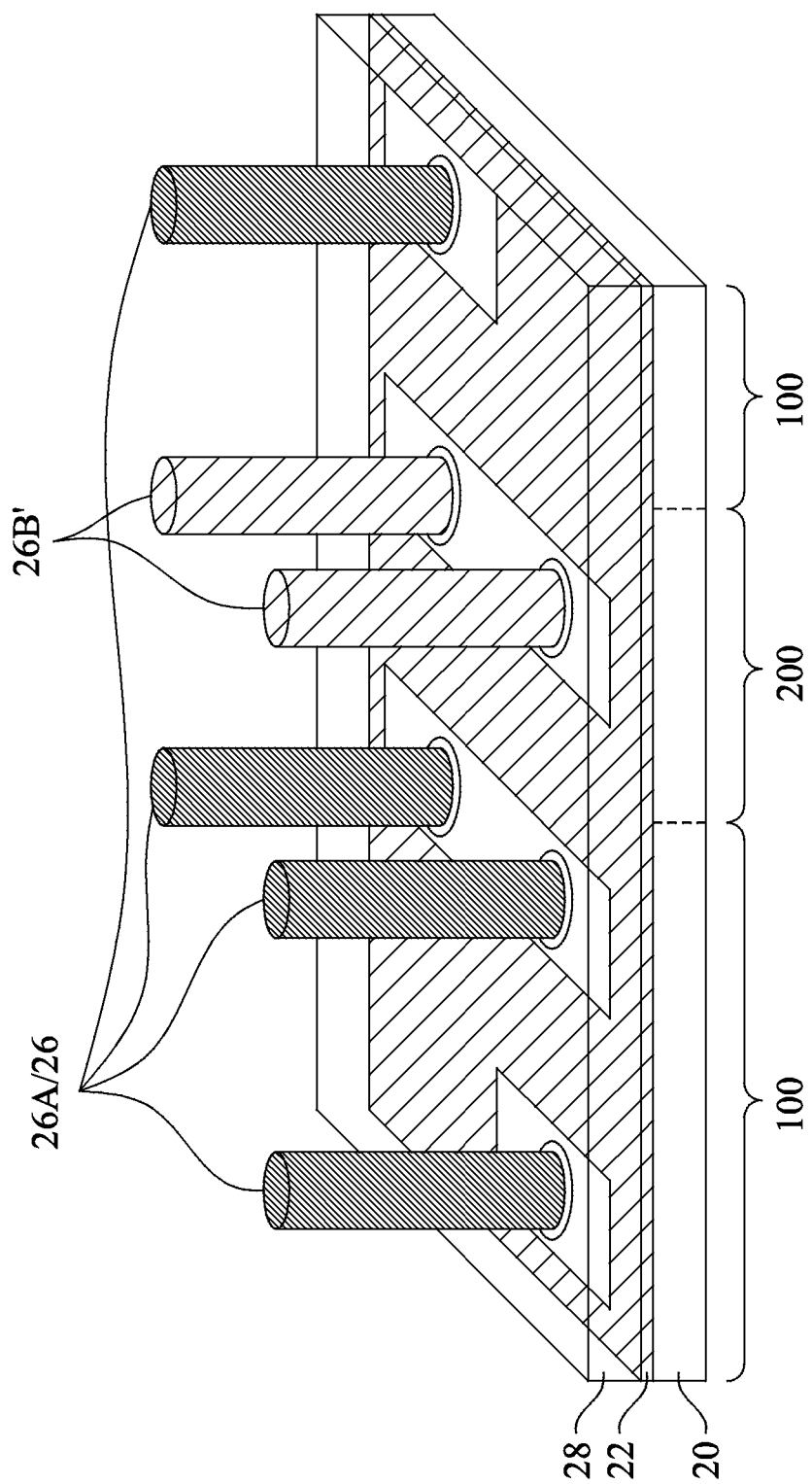

NANOWIRE CMOS STRUCTURE AND FORMATION METHODS

BACKGROUND

Transistors are key components of modern integrated circuits. To satisfy the requirements of increasingly faster switching speed, the drive currents of transistors need to be increasingly higher. At the same time, the gate lengths of transistors are constantly being scaled down. Scaling down the gate lengths leads to undesirable effects known as "short-channel effects," with which the control of current flow by the gates is compromised. Among the short-channel effects are the drain-induced barrier lowering (DIBL) and the degradation of sub-threshold slope, both of which result in the degradation in the performance of transistors.

The use of multi-gate transistor architecture may help the relief of short-channel effects by improving electrostatic control of the gate on the channel. Fin field-effect transistors (FinFET) were thus developed. To further increase the control of the channels, and to reduce the short-channel effects, transistors having gate-all-around structures were also developed, wherein the respective transistors are also referred to as gate all around transistors. In a gate all around transistor, a gate dielectric and a gate electrode fully encircle the channel region. This configuration delivers a good control of the channel, and the short-channel effects are reduced.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A through 2H illustrate the cross-sectional views of intermediate stages in the formation of nanowires in accordance with alternative embodiments;

FIGS. 4A through 4L illustrate the cross-sectional views of intermediate stages in the formation of a Static Random Access Memory (SRAM) cell in accordance with some embodiments;

DETAILED DESCRIPTION

Figure 1A:
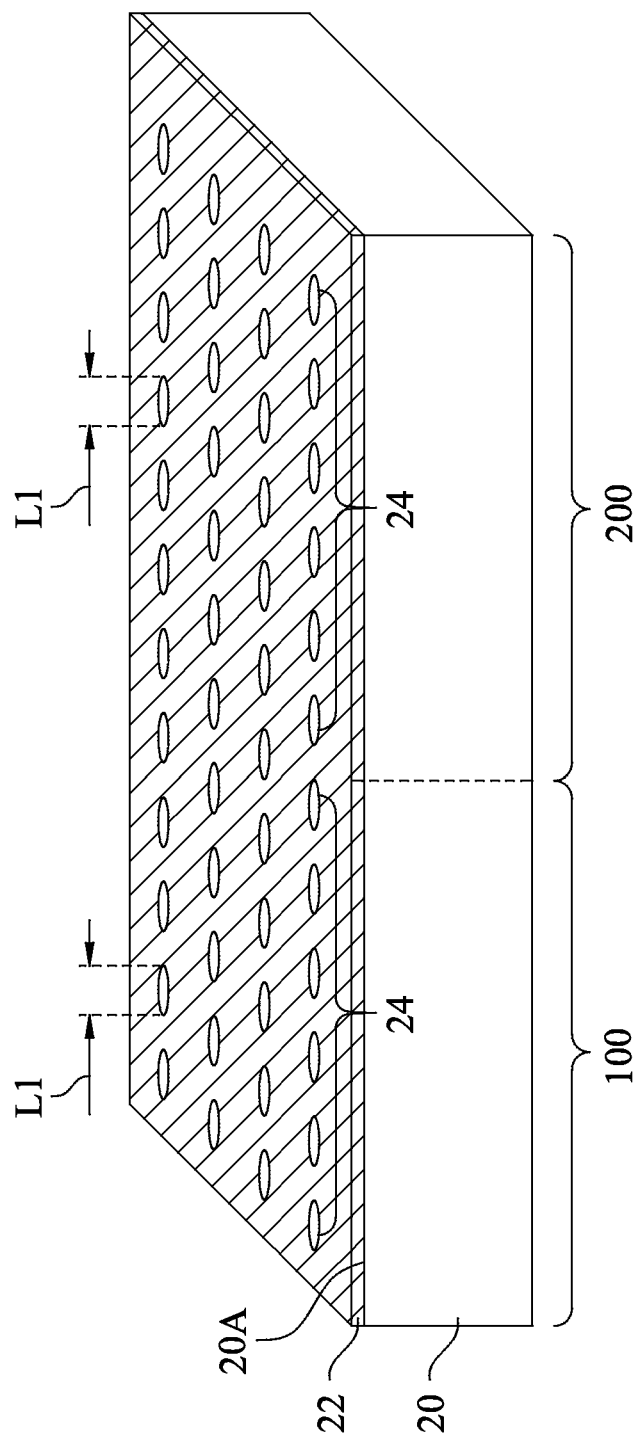
FIGS. 1A through 1J illustrate the cross-sectional views of intermediate stages in the formation of nanowires in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Nanowire and the methods of forming the same are provided in accordance with various exemplary embodiments. Complementary Metal-Oxide-Semiconductor (CMOS) devices and a Static Random Access Memory (SRAM) cell based on the CMOS devices and the methods of forming the same are provided in accordance with various exemplary embodiments. The intermediate stages of forming the nanowires and the SRAM cell are illustrated. The variations of the embodiments are discussed. Throughout the various views and illustrative embodiments, like reference numbers are used to designate like elements.

Figure 5:
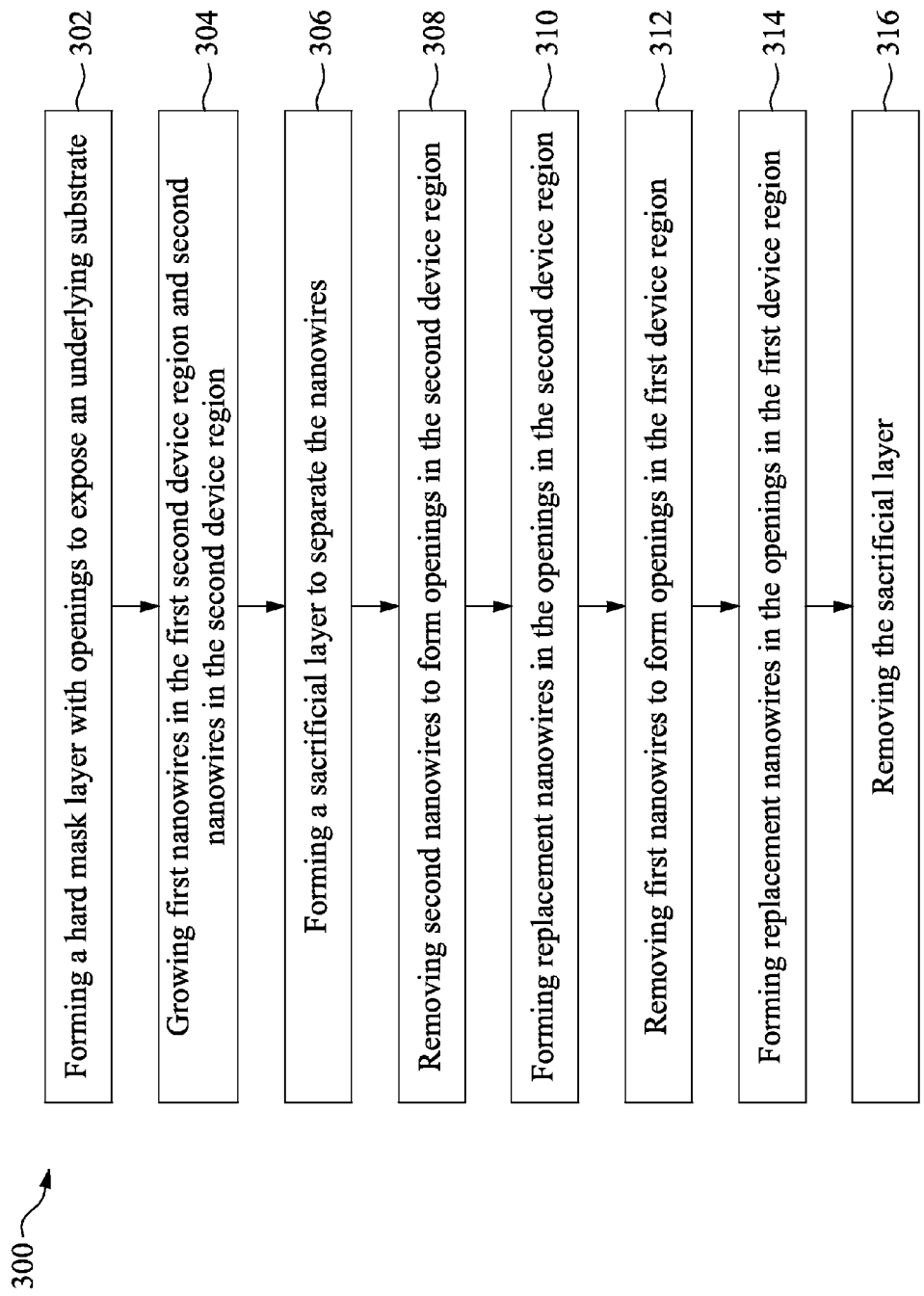
FIG. 5 illustrates the process flow for forming some exemplary nanowires.

FIGS. 1A through 1J are perspective views of intermediate stages in the formation of nanowires for CMOS devices in accordance with some embodiments of the present disclosure. The steps shown in FIG. 1A through 1J are also illustrated schematically in the process flow 300 as shown in FIG. 5. In the subsequent discussion, the process steps shown in FIGS. 1A through 1J are discussed referring to the process steps in FIG. 5.

FIG. 1A illustrates a perspective view of an initial structure. The initial structure includes substrate 20. Substrate 20 may be a semiconductor substrate, which may further be a silicon substrate, a silicon germanium substrate, or a substrate formed of other semiconductor materials. Substrate 20 may be doped with a p-type or an n-type impurity. In accordance with some embodiments in which substrate 20 is a silicon substrate (which may or may not be free from germanium), substrate 20 may be a (001) substrate or a (111) substrate, wherein top surface 20A has a (001) surface plane or a (111) surface plane of crystal silicon.

Substrate 20 includes a first portion in device region 100 and a second portion in device region 200. In accordance with some embodiments of the present disclosure, one of the device regions 100 and 200 is an N-type Metal-Oxide Semiconductor (NMOS) region, and the other is a P-type Metal-Oxide Semiconductor (PMOS) region. For example, in the exemplary embodiments discussed throughout description, device region 100 is referred to as the NMOS region, in which NMOS devices having nanowires as channel regions are to be formed, and device region 200 is referred to as the PMOS region, in which PMOS devices having nanowires as channel regions are to be formed. It is appreciated that in alternative embodiments, device region 100 may be a PMOS region, and device region 200 may be an NMOS region.

Further referring to FIG. 1, hard mask layer 22 is formed. In accordance with some embodiments, hard mask layer 22 comprises a dielectric material. Exemplary materials of hard mask layer 22 include, and are not limited to, silicon nitride, silicon oxide, aluminum oxide, silicon carbide, and silicon oxynitride. The formation of hard mask layer 22 may include a deposition method such as Plasma Enhanced Chemical Vapor Deposition (PECVD), Low-Pressure Chemical Vapor Deposition (LPCVD), and the like. Hard mask layer 22 may also be formed by performing a thermal oxidation on substrate 20, and the resulting hard mask layer 22 is an oxide layer comprising, for example, silicon oxide.

Figure 4A:
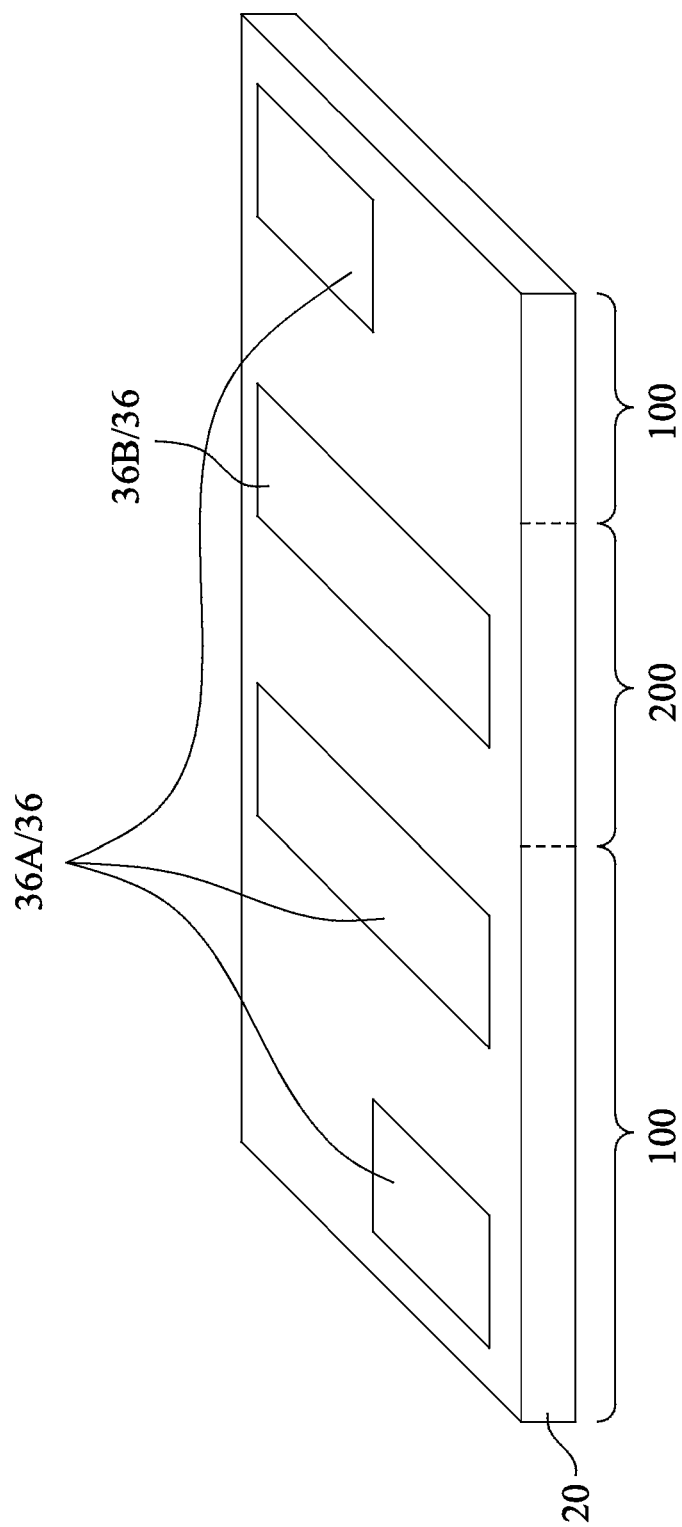

In accordance with some embodiments of the present disclosure, portions of substrate 20 in device regions 100 and 200 are implanted with p-type impurities (such as boron or indium) or n-type impurities (such as phosphorous, arsenic, or antimony). The implanted regions have reduced resistivity, and hence may act as source/drain regions of the CMOS devices, or the power strips such as VDD strips or VSS strips. An exemplary process may be found referring to FIG. 4A.

Referring back to FIG. 1A, hard mask layer 22 is patterned in an etching step to form openings 24, wherein the top surface of the underlying substrate 20 is exposed through openings 24. The respective step is shown as step 302 in the process flow 300 shown in FIG. 5. In accordance with some embodiments in which substrate 20 is a (001) or a (111) substrate, the (001) or (111) surface is exposed. The top-view shape of openings 24 may be circles or polygons such as triangles, rectangles, hexagons, or the like. The lateral dimension L1 of openings 24 may be in the range between about 5 nm and about 200 nm, and larger or smaller openings 24 may also be adopted.

Figure 1B:
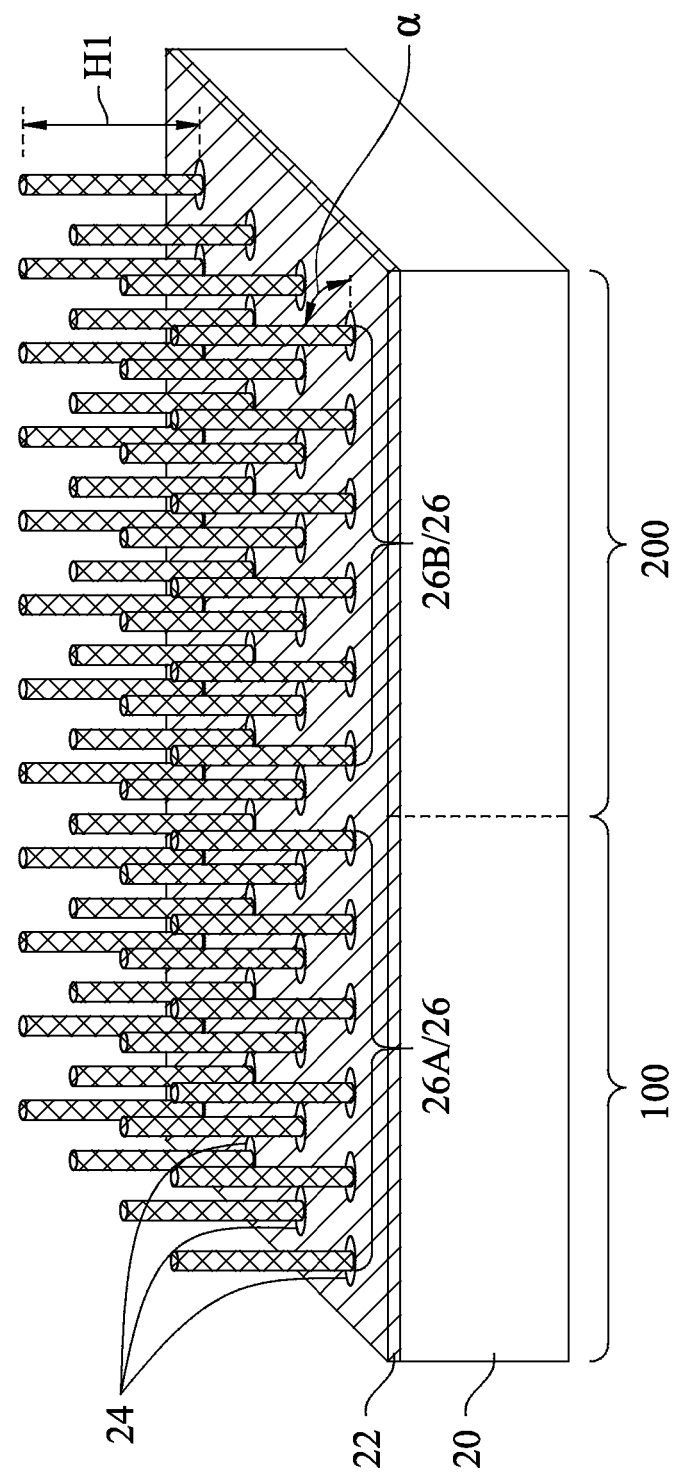

Next, referring to FIG. 1B, nanowires 26 are grown from openings 24. The respective step is shown as step 304 in the process flow 300 shown in FIG. 5. Nanowires 26 include nanowires 26A in NMOS region 100 and nanowires 26B in PMOS region 200, wherein nanowires 26A and 26B are formed simultaneously, and may have the same shape and the same dimensions. The epitaxy may be performed through Metal-Organic Chemical Vapor Deposition (MOCVD) in some exemplary embodiments. Openings 24 may act as the template for defining the top-view shape of nanowires 26. In some embodiments in which indium is included in the nanowires 26 that are to be grown, indium itself acts as a catalyst, and no metal catalyst such as gold is needed for growing nanowires 26. Nanowires 26 may thus be grown directly from the top surface of substrate 20.

Nanowires 26 may comprise a III-V compound semiconductor such as InAs, GaSb, or GaN in accordance with some embodiments. When nanowires 26 that comprise InAs are to be grown in accordance with some embodiments, trimethylarsenic (TMA) or arsene ($AsH_3$) may be used as the precursor for providing arsenic, and trimethylindium (TMI) may be used as the precursor for providing indium. During the nanowire growth, nucleation of the nanowires 26 is incurred first. This may be achieved at low growth temperatures between about 350° C. and about 450° C. The subsequent growth of nanowires 26 may be performed at temperatures between about 300° C. and about 600° C. During the nanowire growth, the respective chamber pressure may be between about 100 mbar and about 400 mbar. The carrier gas flow rate may be between about 25 sccm and about 100 sccm. The growth time may be between about 10 seconds and about 1,000 seconds. The carrier gas may include hydrogen ($H_2$). To minimize lateral growth, a low VIII precursor ratio (the flow rate ratio of the group-V precursor to group-III precursor) may be used. For example, when the precursors include $AsH_3$ and TMI, ratio $AsH_3$/TMI may be between about 5 and about 100. Furthermore, a high growth temperature suppresses the lateral growth. The optimum vertical growth conditions are related with various factors, and may be found through experiments.

Through the adjustment of process conditions, nanowires 26 grow vertically without expanding laterally. Accordingly, the top portion, the bottom portion, and the intermediate portions of nanowires 26 have the same lateral dimensions and shapes. The sidewalls of nanowires 26 are also perpendicular to or substantially perpendicular to the top surface of substrate 10, for example, with tilt angle α being between and including about 89 degrees and about 90 degrees. The desirable height H1 of nanowires 26 is determined by the dimensions of the respective CMOS devices. In some exemplary embodiments, height H1 is in the range between about 30 nm and about 100 nm.

In some embodiments, the top-view shape and the dimensions of nanowires 26 are defined by, and hence are the same as, the respective top-view shape and dimensions of openings 24. In these embodiments, after the growth of nanowires 26, all exposed surfaces of substrate 20 (as shown in FIG. 1B) are covered by nanowires 26. In alternative embodiments, with appropriate sizes of openings 24, the top-view areas of nanowires 26 are smaller than the top-view areas of the respective nanowires 26. In these embodiments, nanowires 26 may be grown from a portion (such as a center portion), but not all, of the respective openings 24. Some areas of openings 24, however, do not have nanowires 26 grown from it, and hence some portions of the top surface of substrate 20 are exposed after the formation of nanowires 26, as show in FIG. 1B.

In alternative embodiments, other III-V compound semiconductor materials that can be grown vertically to form nanowires are used to form nanowires 26. The exemplary candidate materials include InAs, InP, GaAs, GaSb, GaN, and InSb, for example.

Figure 1C:
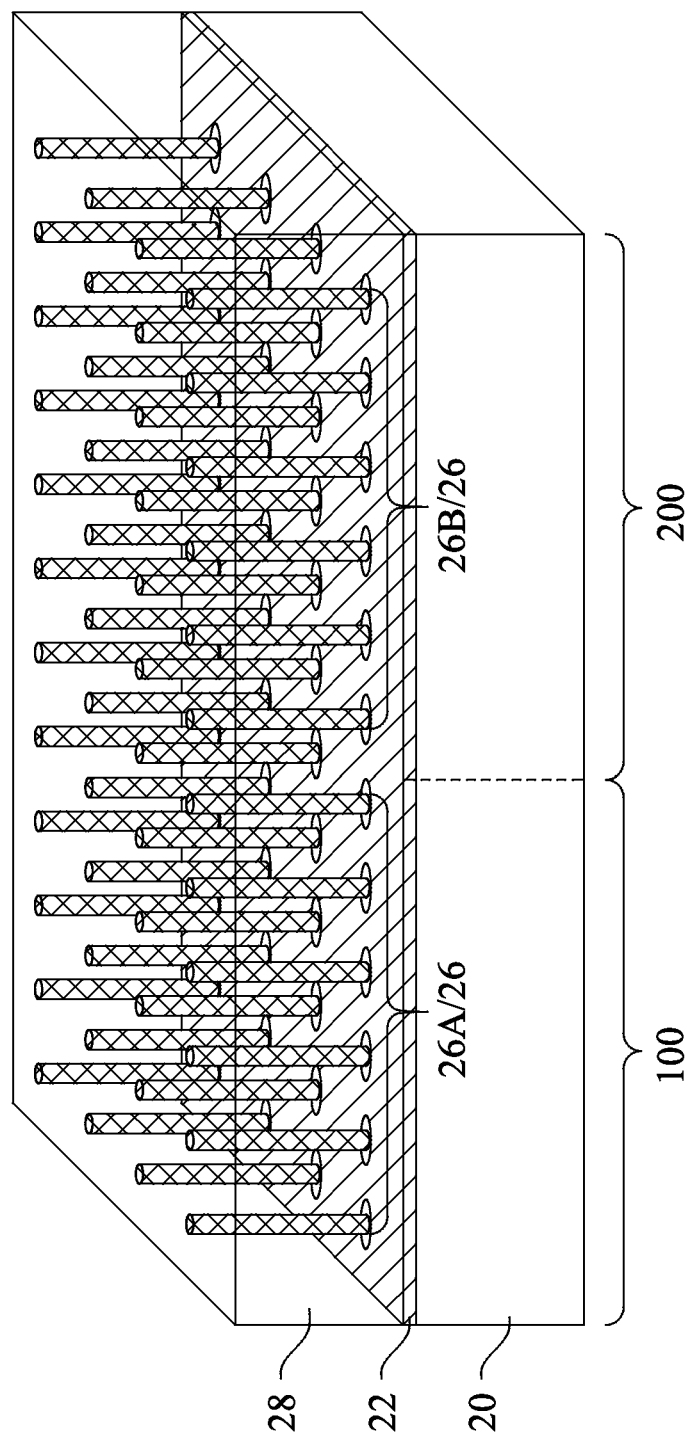

Next, as shown in FIG. 1C, sacrificial dielectric layer 28 is formed. The respective step is shown as step 306 in the process flow 300 shown in FIG. 5. In accordance with some embodiments, sacrificial dielectric layer 28 is formed by spin-on coating, Flowable Chemical Vapor Deposition (FCVD), or the like. Sacrificial dielectric layer 28 may be formed of an oxide, a nitride, or the like. The material of sacrificial dielectric layer 28 may also be selected from the same group of candidate materials for forming hard mask layer 22. The materials of hard mask layer 22 and sacrificial dielectric layer 28 may be different from each other or the same as each other. In accordance with some embodiments, sacrificial dielectric layer 28 is filled to a level higher than the top surface of nanowires 26. A planarization such as Chemical Mechanical Polish (CMP) is then performed to level the top surface of sacrificial dielectric layer 28 with the top surfaces of nanowires 26. The top surfaces of nanowires 26 are accordingly exposed.

Figure 1D:
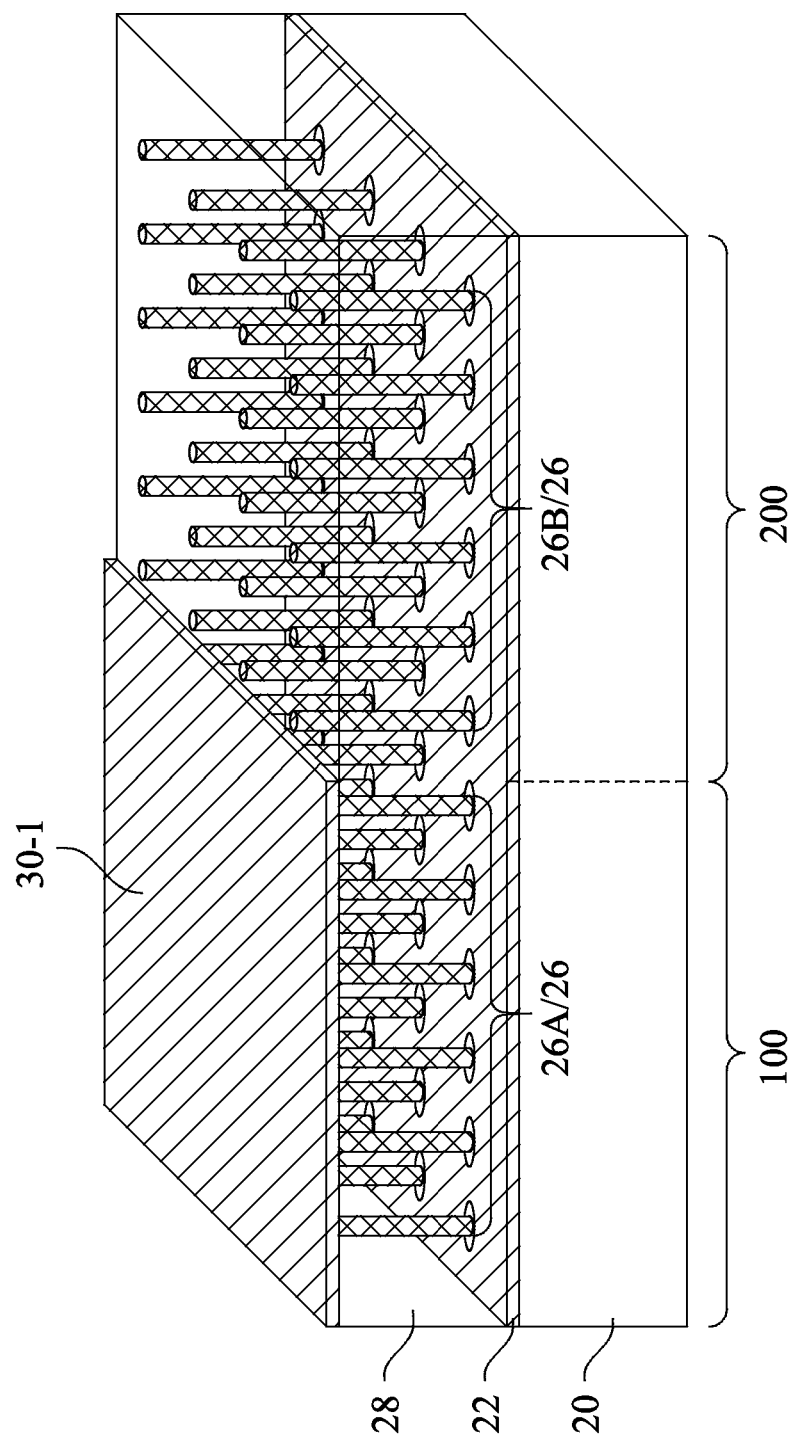

FIG. 1D illustrates the formation of mask layer 30-1. In some embodiments, mask layer 30-1 is formed in both NMOS region 100 and PMOS region 200. A photo lithography process is then performed to remove mask layer 30-1 from PMOS region 200, leaving mask layer 30-1 in NMOS region 100. Nanowires 26A are thus protected by mask layer 30-1. In accordance with some embodiments, mask layer 30-1 is formed of a nitride such as silicon nitride, an oxide such as silicon oxide, a carbide such as silicon carbide, an oxynitride such as silicon oxynitride, or the like.

Figure 1E:
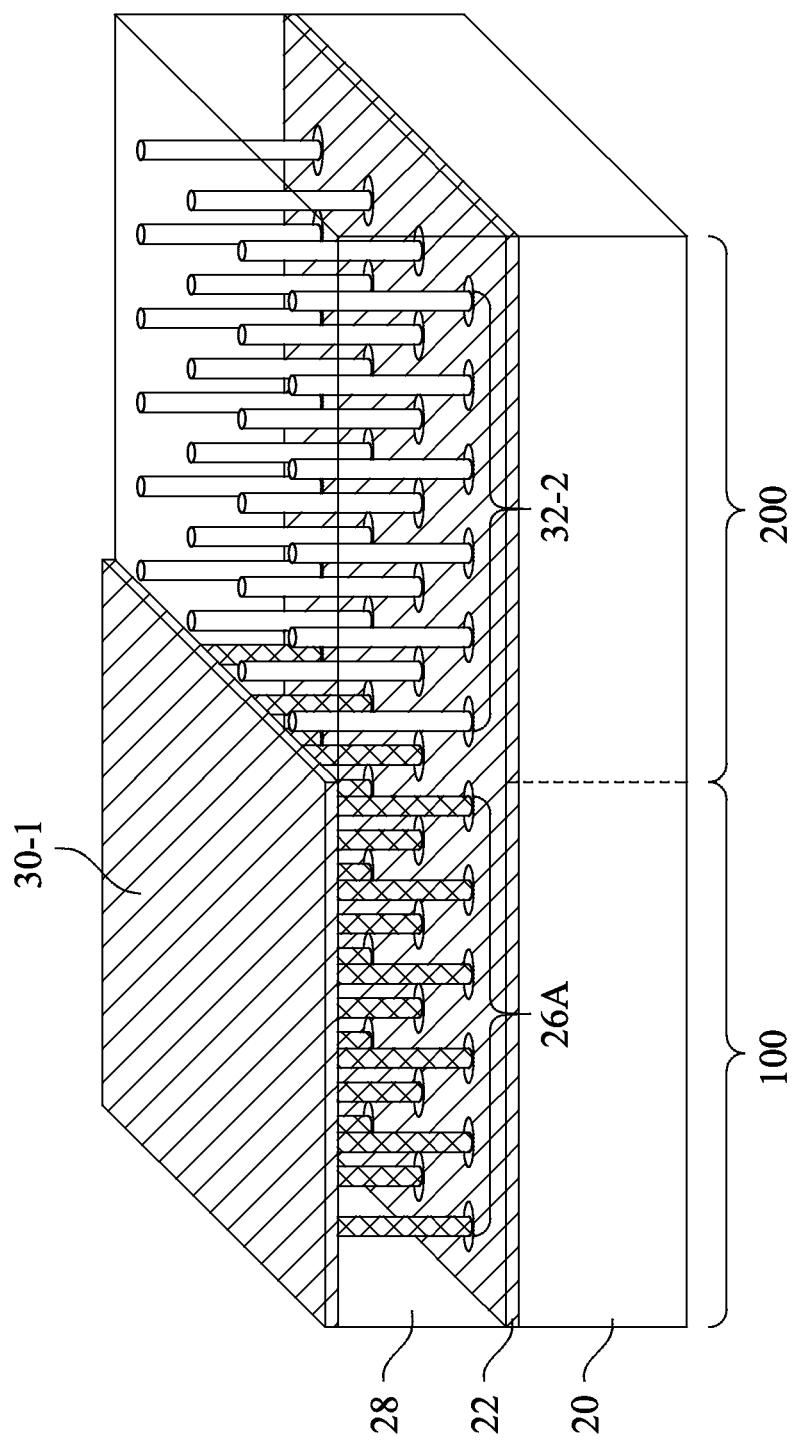

Nanowires 26B are then removed, and the resulting structure is shown in FIG. 1E. The respective step is shown as step 308 in the process flow 300 shown in FIG. 5. In accordance with some embodiments, nanowires 26B are removed in a wet etch process. The etchant is selected to have a very high etching selectivity (the ratio of the etching rate of nanowires 26B to the etching rate of sacrificial layer 28), for example, 100 or higher. For example, when nanowires 26B comprise InAs, diluted HCl solution or a mixture of citric acid and peroxide may be used as the etchant. As a result, nano-openings 32-2 are formed.

In accordance with some embodiments of the present disclosure, nanowires 26B are fully removed. In alternative embodiments, the top parts of nanowires 26B are removed, while the bottom parts of nanowires 26B are left unremoved. The unremoved portions of nanowires 26B may form a first source/drain region of a Tunnel Field-Effect Transistor (TFET), whose source and drain regions have opposite conductivity types. In these embodiments, the subsequently formed nanowires 26B' (FIG. 1F) may include intrinsic epitaxy regions over and in contact with the unremoved bottom portions of nanowires 26B. The intrinsic epitaxy regions may form the channel regions of the resulting TFET. A second source/drain region may be epitaxially grown over the intrinsic channel regions, wherein the second source/drain regions (the top portions of nanowires 26B' (FIG. 1F) have a conductivity type opposite to the conductivity type of the bottom portions of nanowires 26B. In some embodiments in which the unremoved part of nanowires 26B are formed of InAs, the InAs is doped as n-type (as an example), and GaSb may be used in the upper portions of nanowires 26B' and doped as p-type for bandgap alignment.

In the preceding steps, nanowires 26B are used as the templates for forming nano-openings 32-2. Since nanowires 26B have straight and vertical sidewalls that are highly smooth, by using the etchant that has a high etching selectivity, the sidewalls of openings 32-2 (and the subsequently formed replacement nanowires 26B' as in FIG. 1F) are also straight, vertical, and highly smooth. The resulting nanowires 26B' as in FIG. 1F thus have better profiles (straight, vertical, and highly smooth) than conventional nanowires, which are formed by photo lithography processes in which nanowires are either formed by blanket formation followed by patterning, or formed in openings that are formed through photo lithography. After the removal of nanowires 26B, the top surfaces of substrate 20 are again exposed to openings 32-2.

Figure 1F:
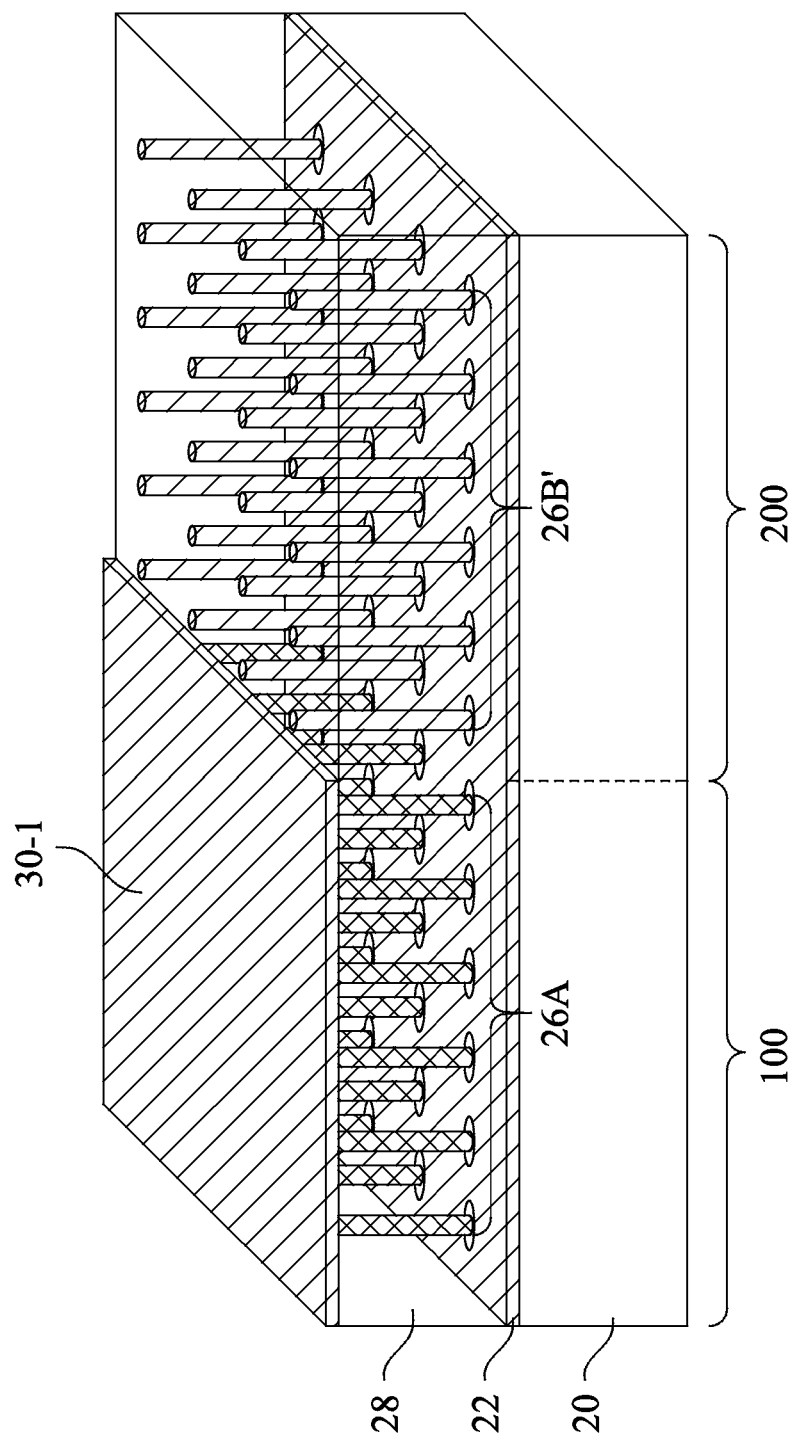

Referring to FIG. 1F, an epitaxy is performed to form semiconductor nanowires 26B', which are alternatively referred to as replacement semiconductor nanowires 26B'. The respective step is shown as step 310 in the process flow 300 shown in FIG. 5. The materials of nanowires 26B' are selected, so that the materials that are desired for forming channels of PMOS devices are used. In some exemplary embodiments, replacement nanowires 26B' are formed of $Si_xGe_{1-x}$ (with x being between and including 0 and 1) or a III-V compound semiconductor such as GaSb or InGaSb. Also, in some exemplary embodiments, replacement nanowires 26B' are also formed of the materials that are not capable of forming upright nanowires (when not supported by surrounding material) from (001) or (111) silicon surfaces. Hence, by using nanowires 26B as templates, the resulting nanowires 26B' may be formed of materials suitable for the channels of PMOS devices, regardless of whether these materials can be grown uprightly by themselves from silicon or not.

In some embodiments, nanowires 26B' is grown until openings 32-2 (FIG. 1E) are fully filled. A planarization such as CMP is then performed to level the top surface of nanowires 26B' with the top surface of sacrificial layer 28. Mask layer 30-1 may be removed in the CMP. In alternative embodiments, the growth of nanowires 26B' is stopped before openings 32-2 (FIG. 1E) are fully filled. Mask layer 30-1 is then removed in a separate etching process.

Figure 1G:
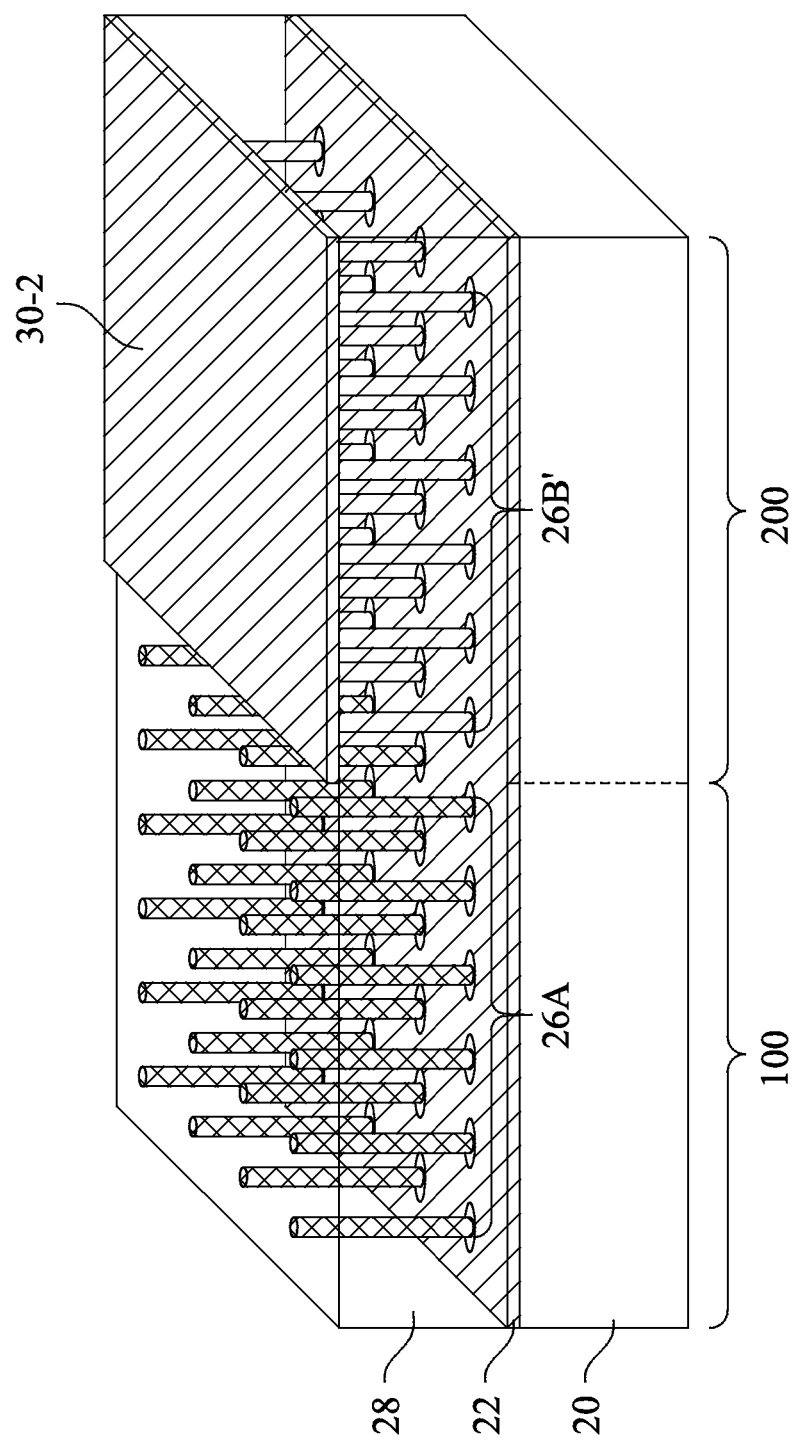
Figure 1H:
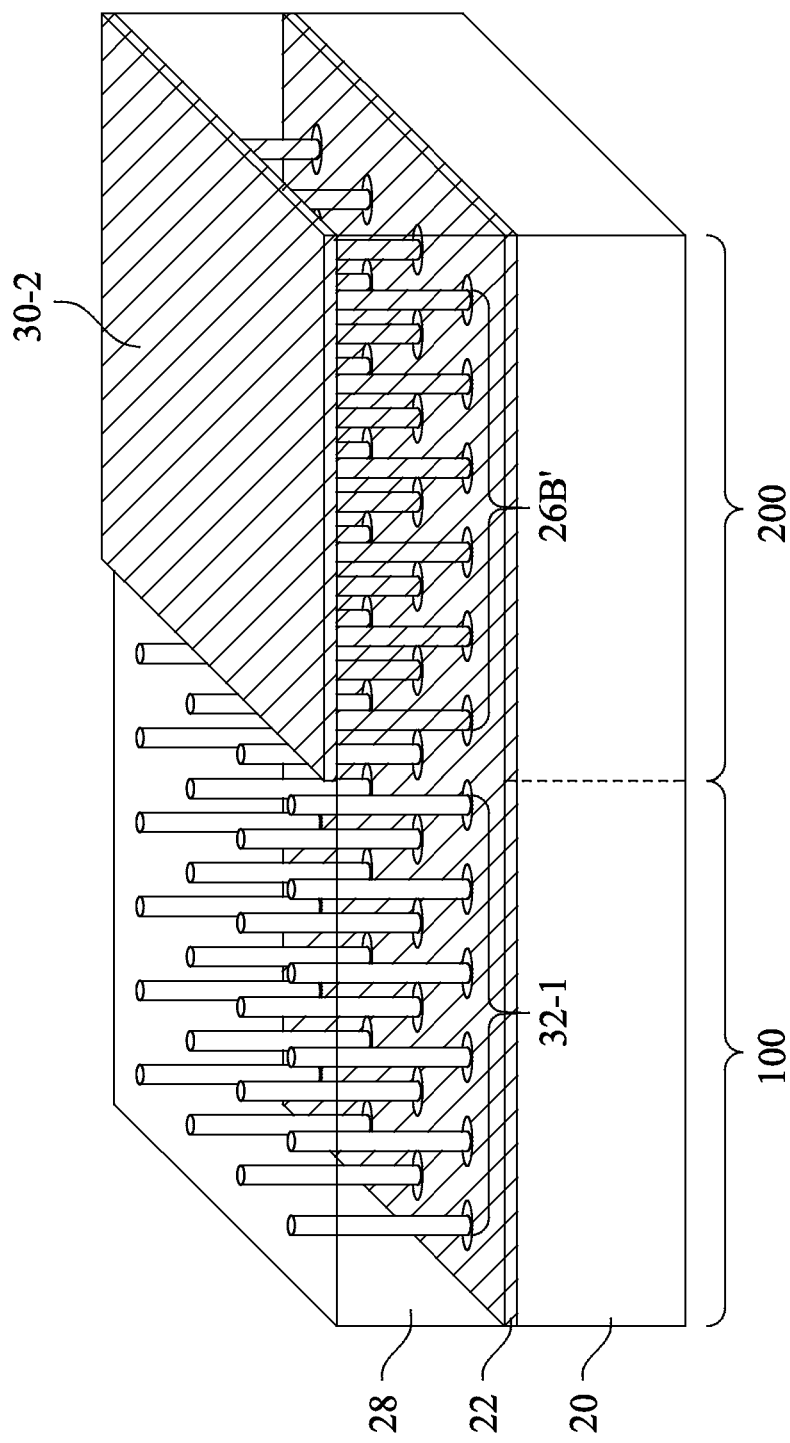
Figure 1I:
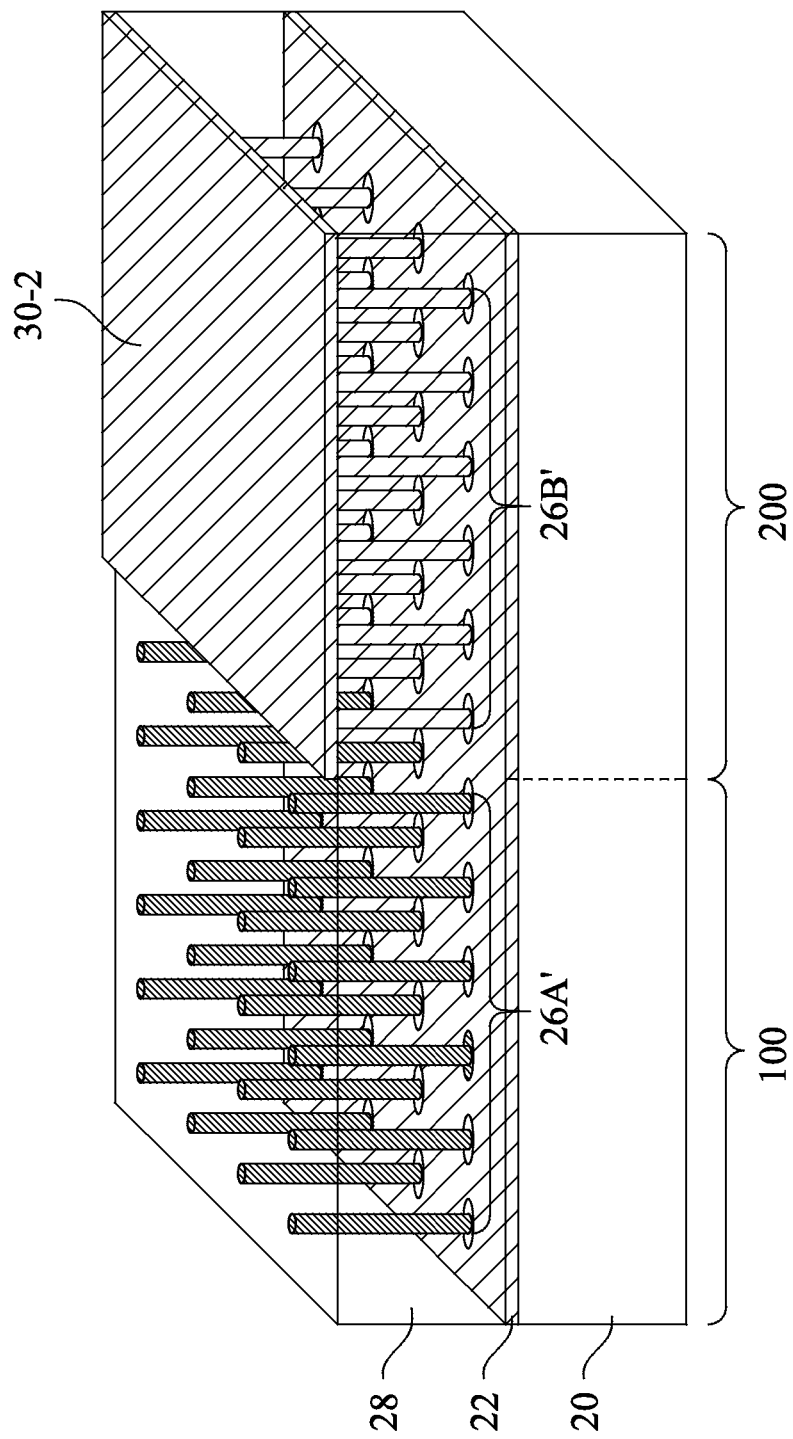

FIGS. 1G through 1I illustrate the removal of nanowires 26A and the formation of replacement semiconductor nanowires 26A'. The process steps are briefly discussed as follows. The processes details are similar to that are illustrated and discussed regarding FIGS. 1D through 1F, except that the material of the resulting nanowires 26A' is different from the material of nanowires 26B'. The details of the processes shown in FIGS. 1G through 1I are thus not repeated herein.

Referring to FIG. 1G, mask layer 30-2 is formed in device region 200 to cover sacrificial layer 28 and nanowires 26B', while a portion of mask layer 30-2 is removed from device region 100. The material of mask layer 30-2 may be selected from the same candidate material for forming mask layer 30-1.

Next, nanowires 26A are removed in an etching step, which is essentially the same as the step in FIG. 1E. The resulting structure is as shown in FIG. 1H, wherein openings 32-1 are formed in sacrificial layer 28, and the top surface of substrate 20 is exposed through openings 32-1. The respective step is shown as step 312 in the process flow 300 shown in FIG. 5.

Referring to FIG. 1I, an epitaxy is performed to form semiconductor nanowires 26A', which are alternatively referred to as replacement nanowires 26A'. The respective step is shown as step 314 in the process flow 300 shown in FIG. 5. The materials of nanowires 26A' are selected so that the materials that are desired for forming the channels of NMOS devices are used. In some exemplary embodiments, replacement nanowires 26A' are formed of $Si_yGe_{1-y}$ (with y being between and including 0 and 1) or a III-V compound semiconductor such as InGaAs. Values x (of nanowires 26B') and y may be different from each other. Also, in some exemplary embodiments, replacement nanowires 26A' are formed of the materials that cannot form upright nanowires (when not supported by surrounding materials) from (001) or (111) silicon surfaces. Hence, by using nanowires 26A as templates, nanowires 26A' may be formed of materials suitable for the channels of NMOS devices, regardless of whether these materials can be grown uprightly by themselves from silicon or not.

In some embodiments, nanowires 26A' are grown until openings 32-1 (FIG. 1H) are fully filled. A planarization such as CMP is then performed to level the top surface of nanowires 26A' with the top surface of sacrificial layer 28. Mask layer 30-2 may be removed in the CMP. In alternative embodiments, the epitaxy for forming nanowires 26A' is stopped before openings 32-1 (FIG. 1H) are fully filled. Mask layer 30-2 is then removed in a separate etching process.

Figure 1J:
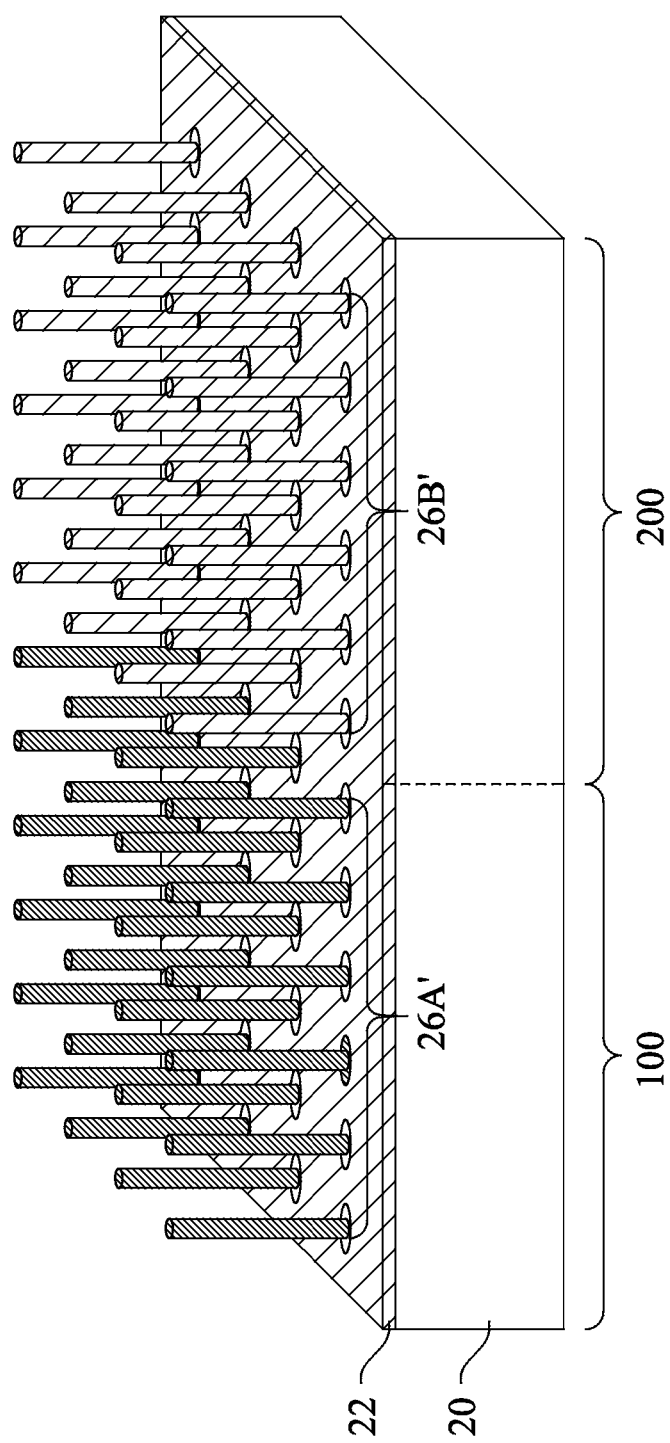

Next, an entirety (or only a top portion) of sacrificial layer 28 is removed, leaving nanowires 26A' and 26B' standing above the top surface of hard mask layer 22. The resulting structure is shown in FIG. 1J. The respective step is shown as step 316 in the process flow 300 shown in FIG. 5. Nanowires 26A' and 26B' are thus formed of different materials, and may have the same height and same top-view shapes and dimensions. In subsequent steps (not shown, refer to FIGS. 4I-4L as an example), additional features may be formed to continue the formation of NMOS devices and PMOS devices in device regions 100 and 200, respectively.

FIGS. 2A through 2H illustrate the perspective views and cross-sectional views of intermediate stages in the formation of nanowires in accordance with alternative embodiments. Unless specified otherwise, the materials and the formation methods of the components in these embodiments are essentially the same as the components that are denoted by the same reference numerals in the embodiments shown in FIGS. 1A through 1J. The details regarding the formation process and the materials of the components shown in FIGS. 2A through 2H (and the embodiments shown in FIGS. 3A through 3H and FIGS. 4A through 4L) may thus be found in the discussion of the embodiments shown in FIGS. 1A through 1J.

Figure 2A:
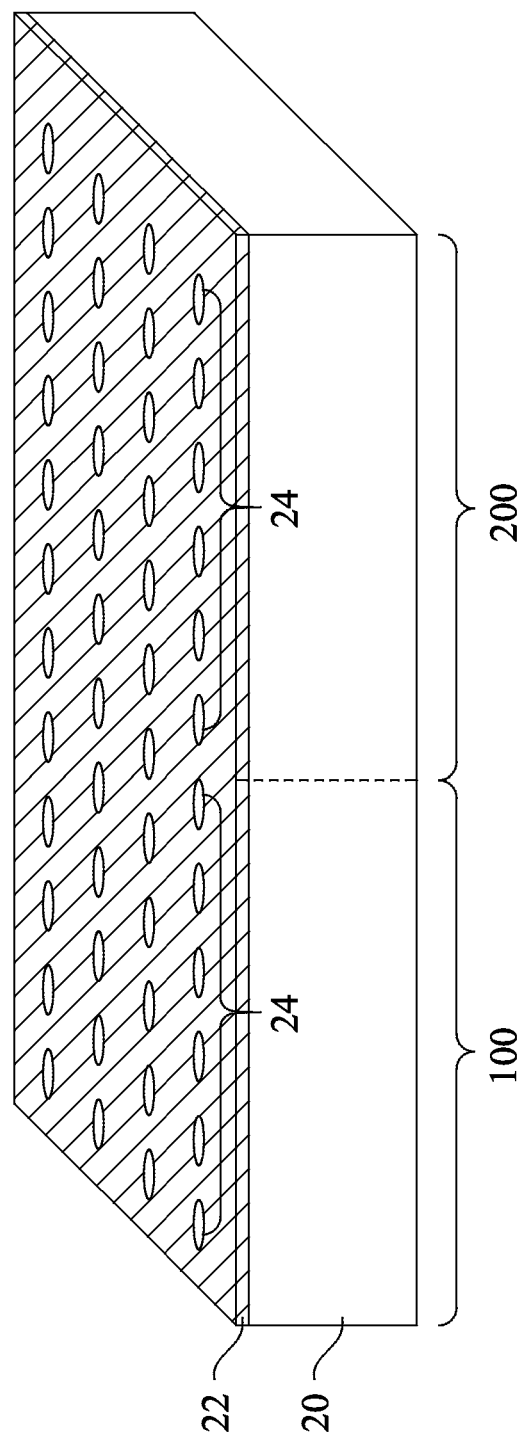
Figure 2B:
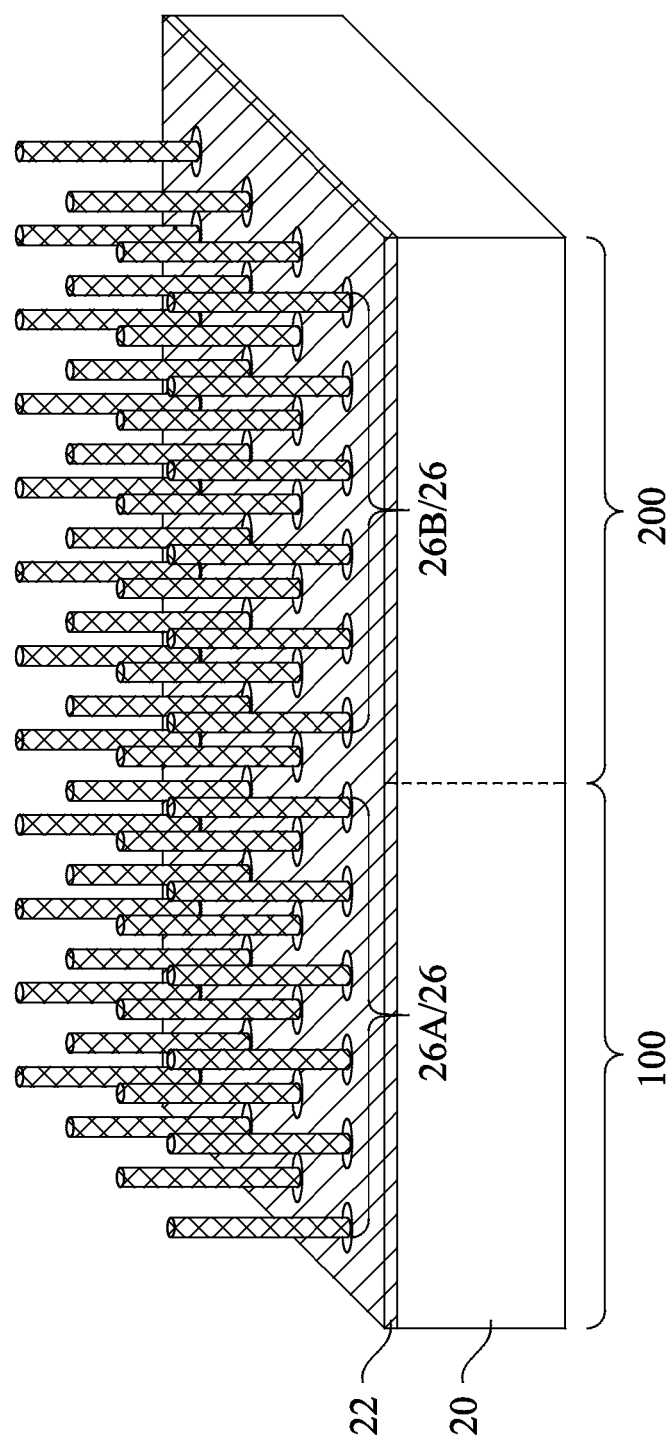
Figure 2C:
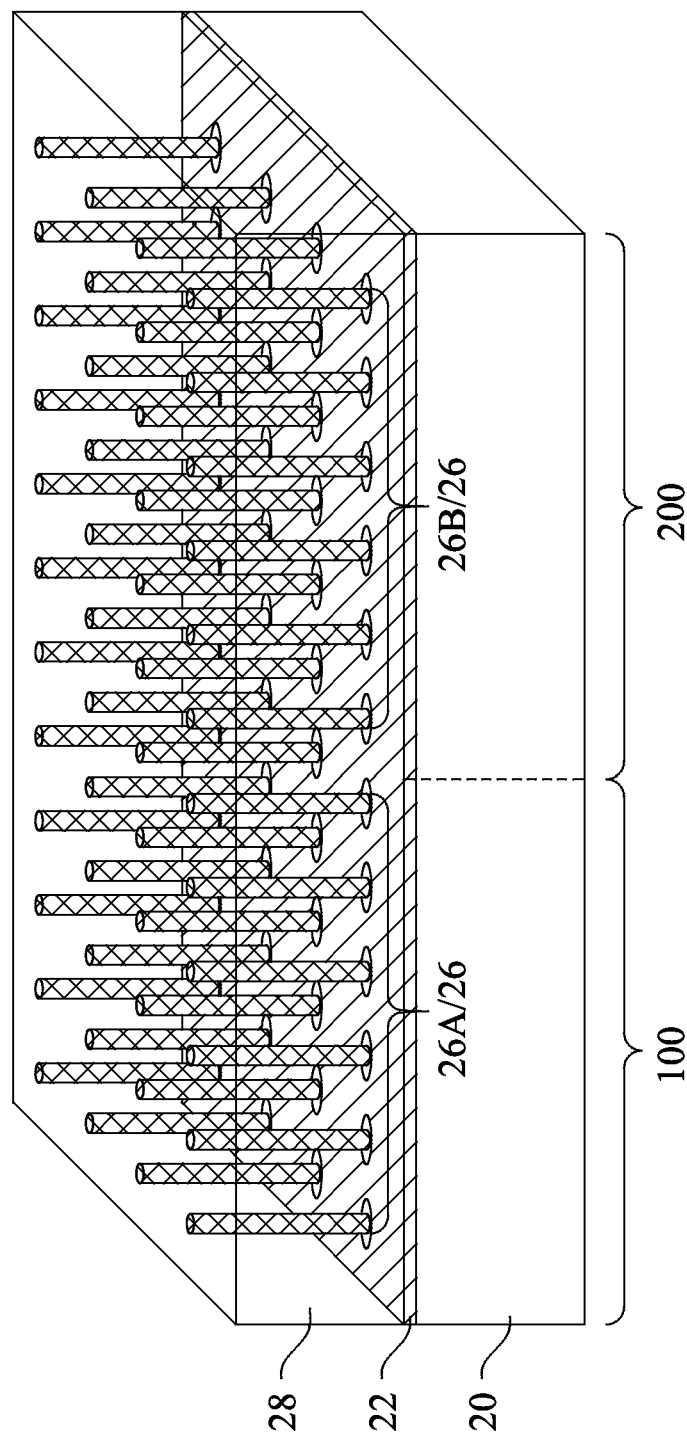
Figure 2D:
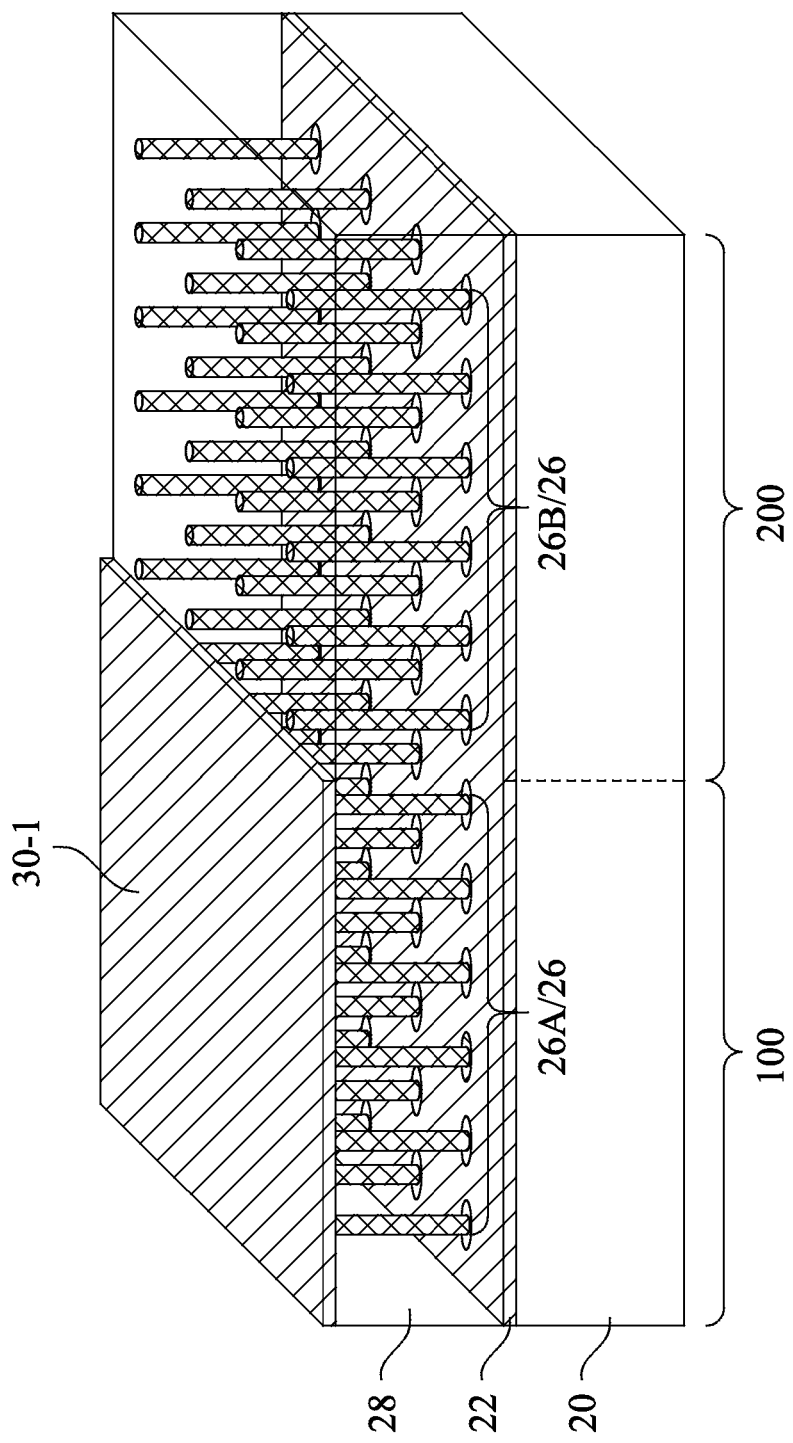
Figure 2E:
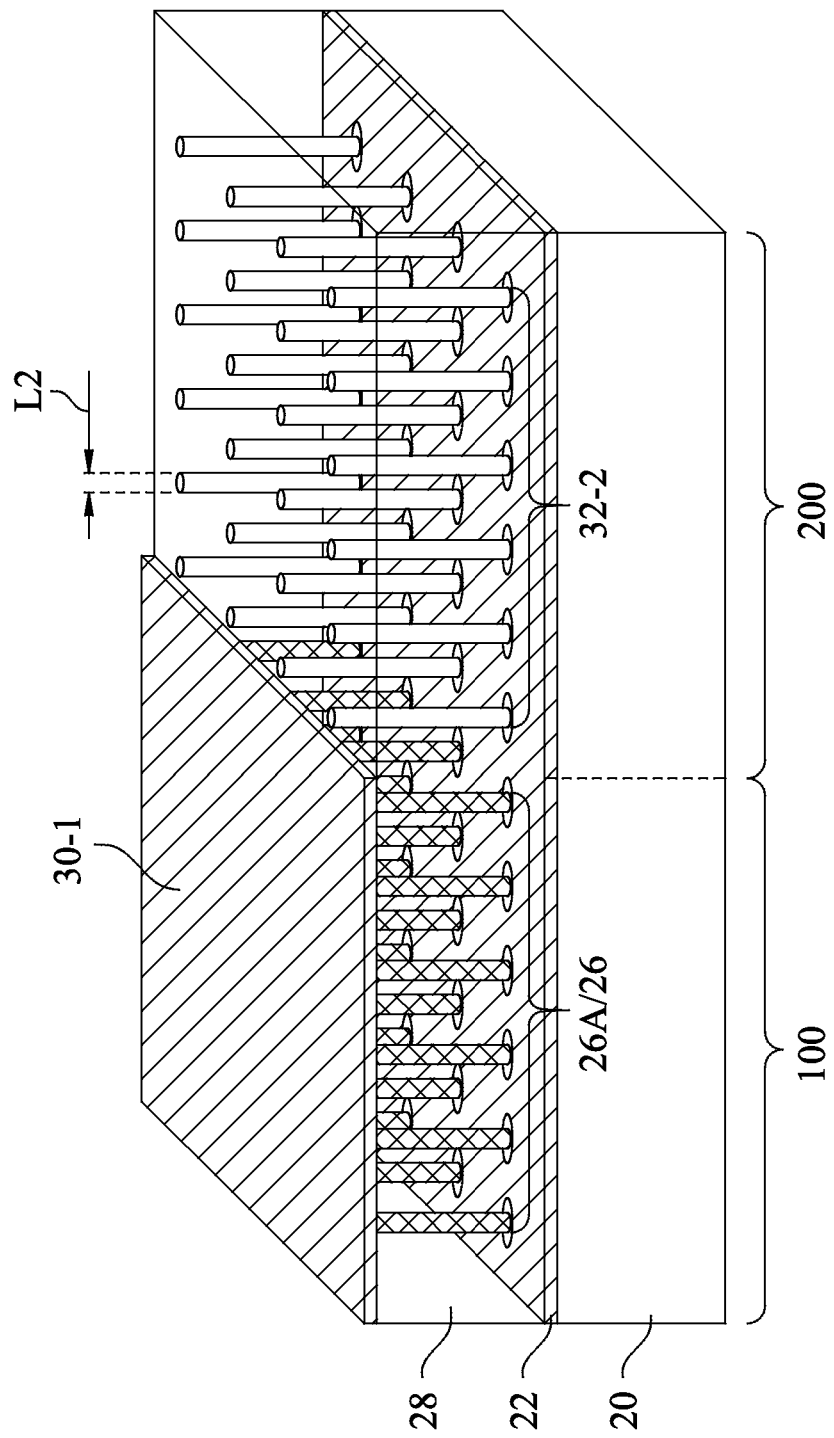

The initial steps of these embodiments are shown in FIGS. 2A through 2D, which are essentially the same as the process steps shown in FIGS. 1A through 1D. The details are thus not repeated herein. Next, as shown in FIG. 2E, nano-openings 32-2 are formed by removing the nanowires 26B as shown in FIG. 2D. The horizontal dimension of nano-openings 32-2 are L2.

Figure 2F:
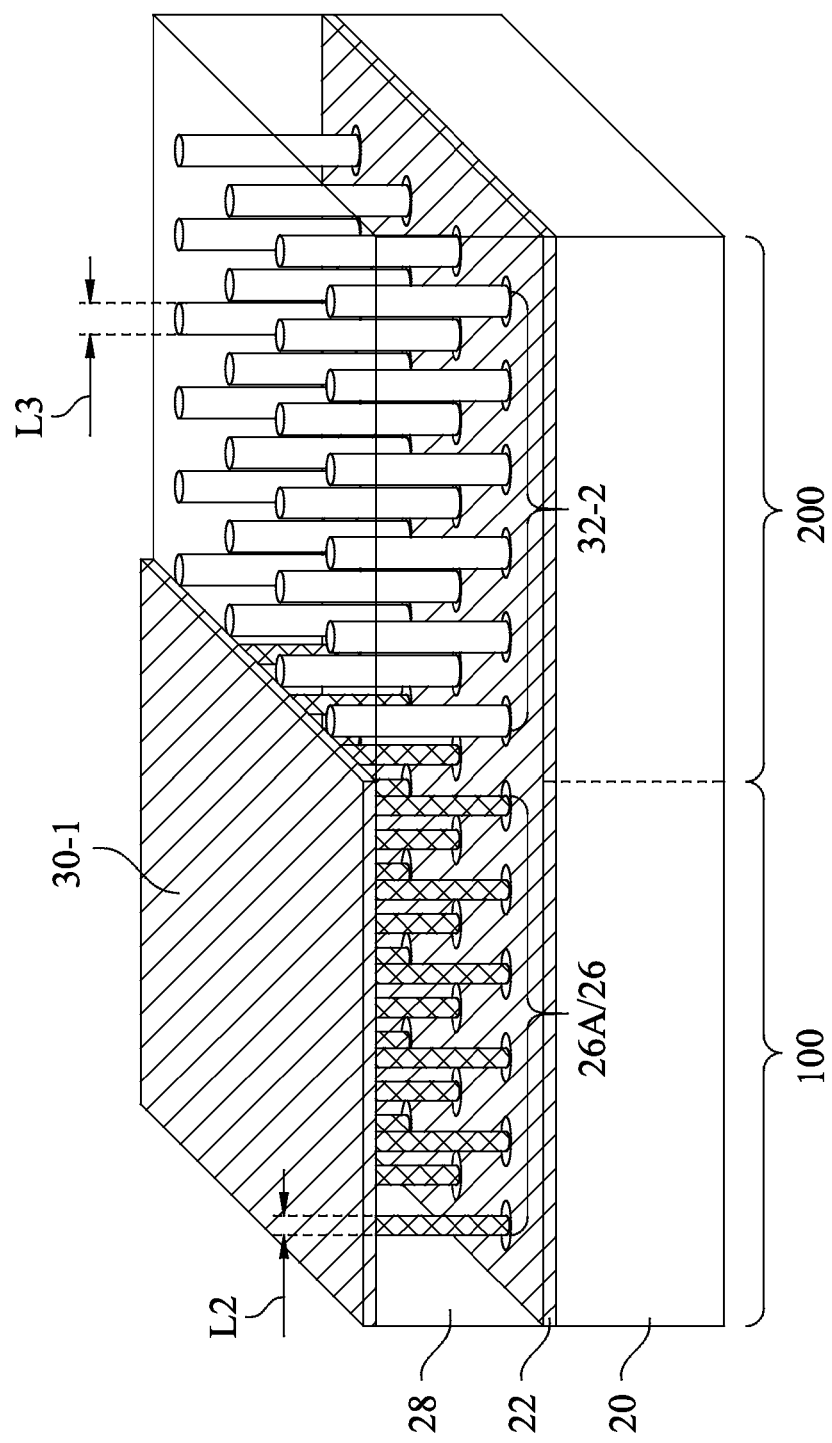

Next, referring to FIG. 2F, the horizontal dimensions of nano-openings 32-2 are changed to L3. In some exemplary embodiments, nano-openings 32-2 are expanded laterally, for example, by wet etch or dry etch, wherein the etchant is selected to attack sacrificial layer 28. In alternative embodiments, the lateral dimensions L3 is reduced compared to lateral dimension L2. Lateral dimension L3 may be greater than or smaller than lateral dimension L2 by about 2 nm, or about 5 nm. Furthermore, ratio L3/L2 (or L2/L3) may be greater than about 1.1, greater than about 1.2, or greater than about 1.5 in some embodiments.

FIGS. 2G-1, 2G-2, and 2G-3 illustrate the cross-sectional views of openings 32-2 in accordance with some embodiments. FIG. 2G-1 illustrates the embodiments in which the lateral dimension L2 of openings 32-2 remains unchanged. In these embodiments, the step shown in FIG. 2F is skipped. FIG. 2G-2 illustrates the embodiments in which the lateral dimension of openings 32-2 is increased to L3. Hence, the step shown in FIG. 2F is performed, which may include a wet etch step or a dry etch step. FIG. 2G-3 illustrates the embodiments in which the lateral dimension L3 of openings 32-2 is reduced from the original dimension L2. For example, as shown in FIG. 2G-3, a Direct Self Assembly (DSA) layer 34 is formed on the sidewalls and possibly the top surface of sacrificial layer 28. The formation may include coating a block polymer on the exposed surfaces of sacrificial layer 28, and then annealing, so that the block polymer react with a surface layer of sacrificial layer 28 to form DSA layer 34.

Figure 2H:
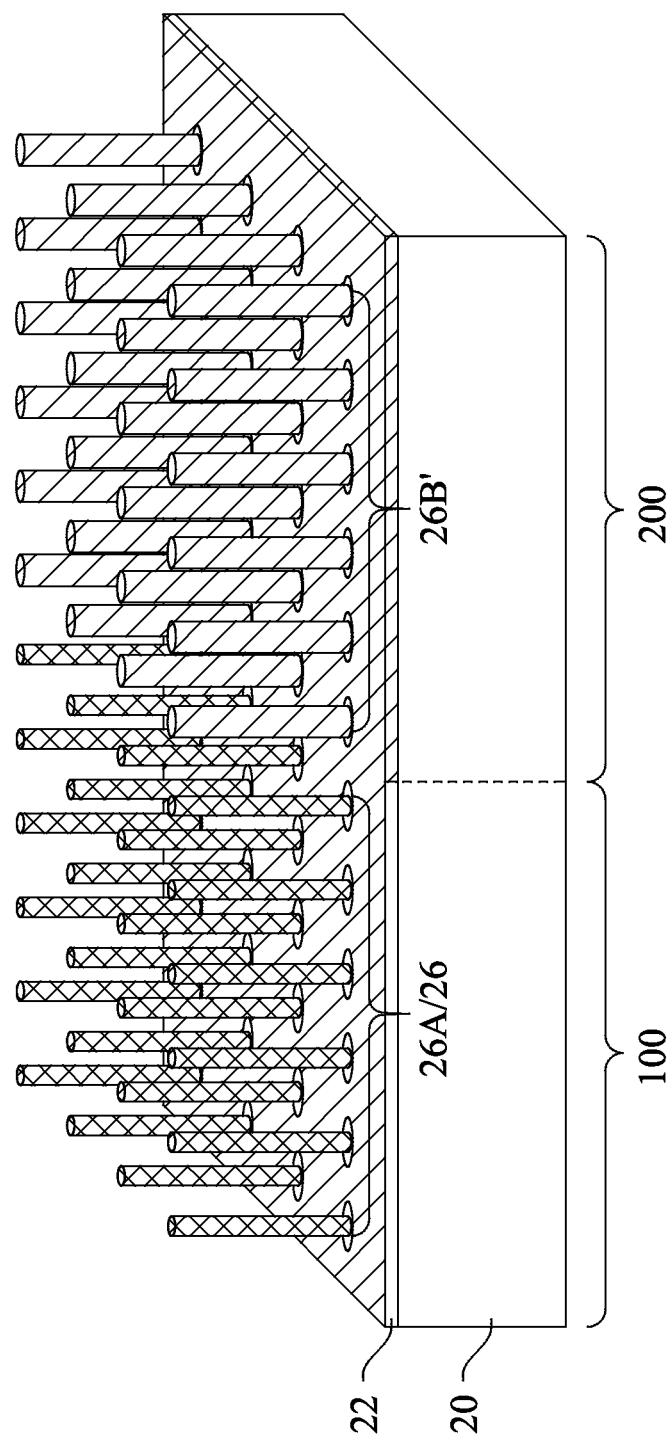

In a subsequent step, nanowires 26B' as shown in FIG. 2H are formed in nano-openings 32-2 (FIG. 2F). The process may be similar to the process shown in FIG. 1F. In accordance with some embodiments, after the formation of nanowires 26B', mask layer 30-1 is removed, followed by the removal of sacrificial layer 30, and the resulting structure is shown in FIG. 2H. In alternative embodiments, after the formation of nanowires 26B', the steps shown in FIGS. 1G through 1J are performed to replace nanowires 26A with nanowires 26A'.

In subsequent steps (not shown, refer to FIGS. 4I-4L as an example), additional features may be formed to continue the formation of NMOS devices and PMOS devices in device regions 100 and 200, respectively.

FIGS. 3A through 3H illustrate the formation of nanowires in accordance with alternative embodiments. These embodiments are similar to the embodiments in FIGS. 2A-2H, except that the height of nanowires in NMOS region 100 are different from the height of nanowires in PMOS region 200.

Figure 3A:
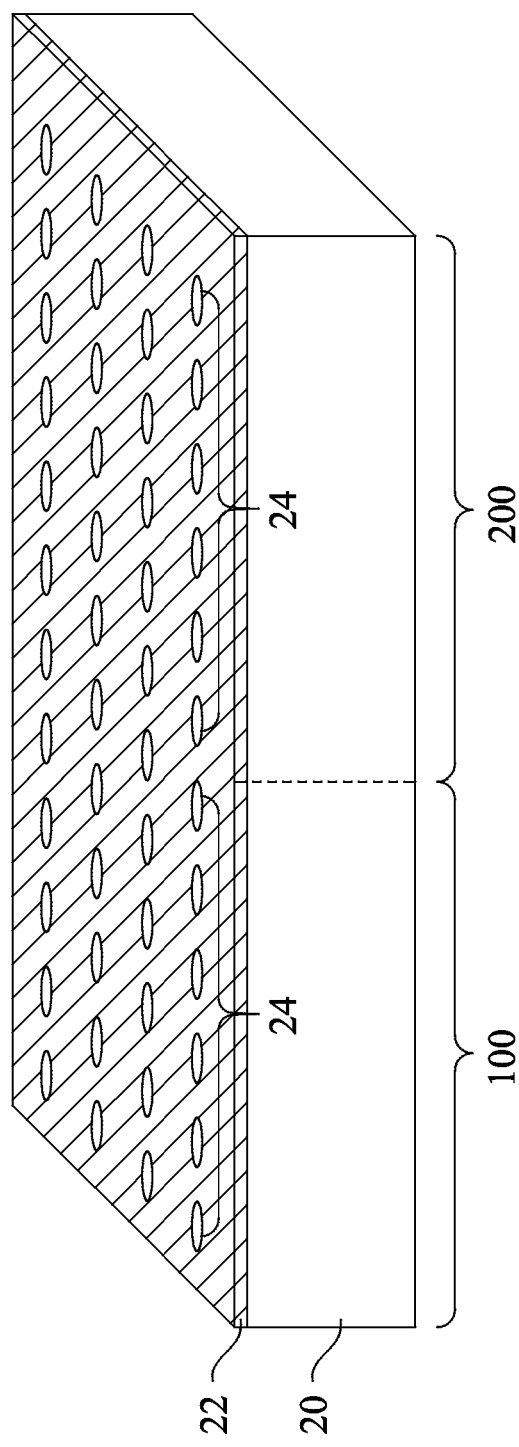
FIGS. 3A through 3H illustrate the cross-sectional views of intermediate stages in the formation of nanowires in accordance with some embodiments.
Figure 3B:
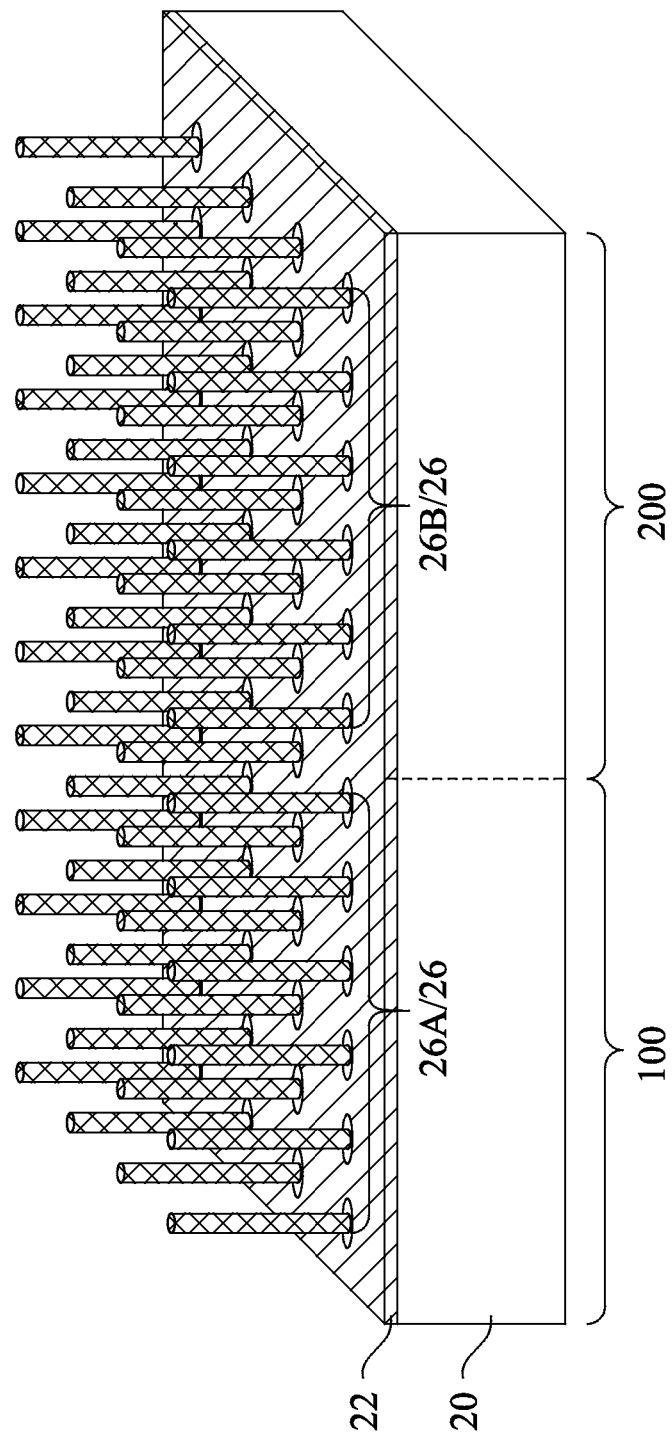
Figure 3C:
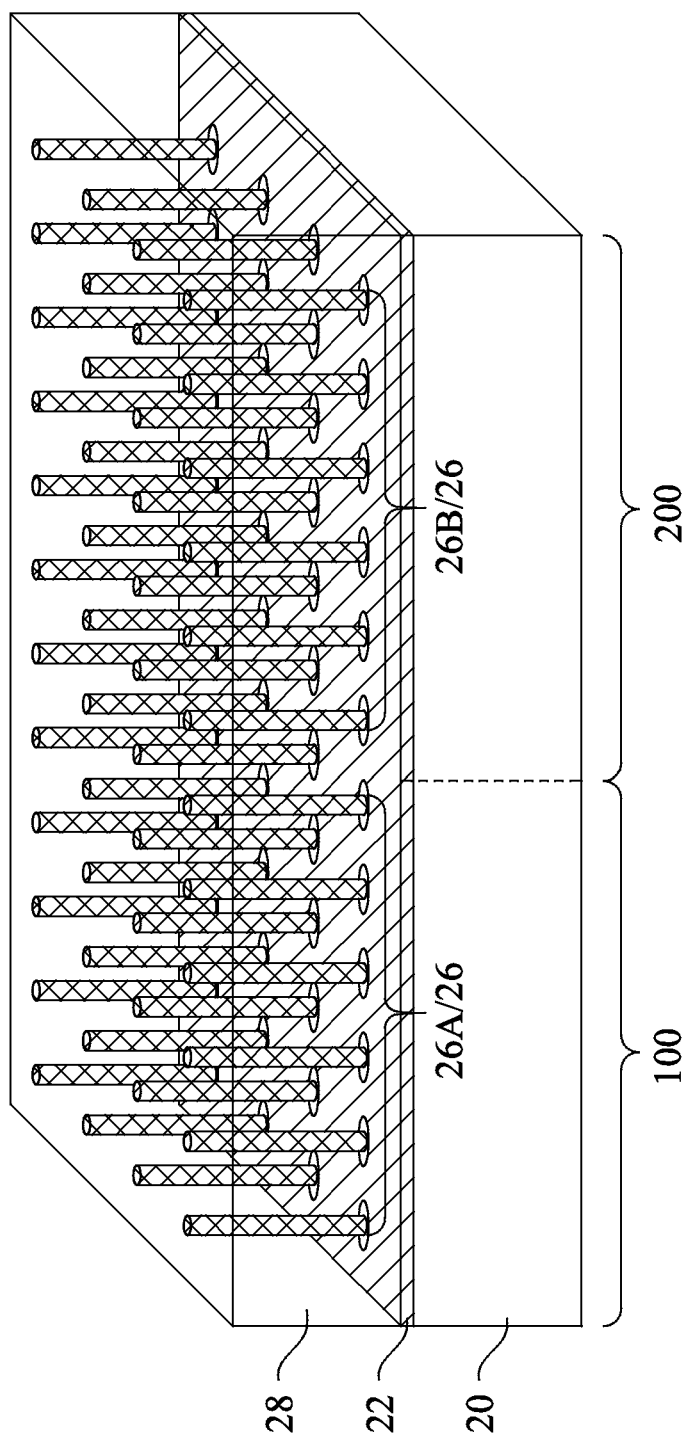
Figure 3D:
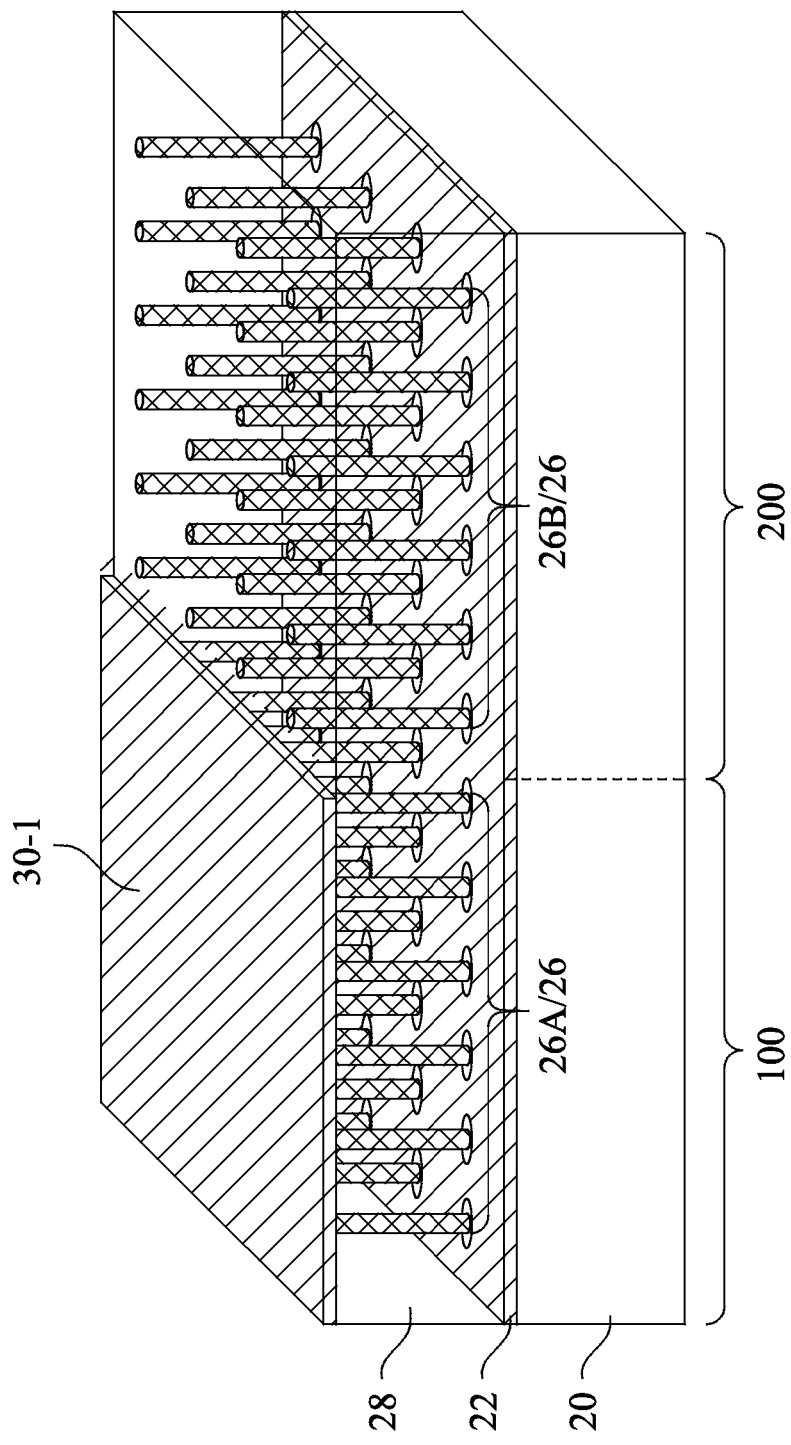
Figure 3E:
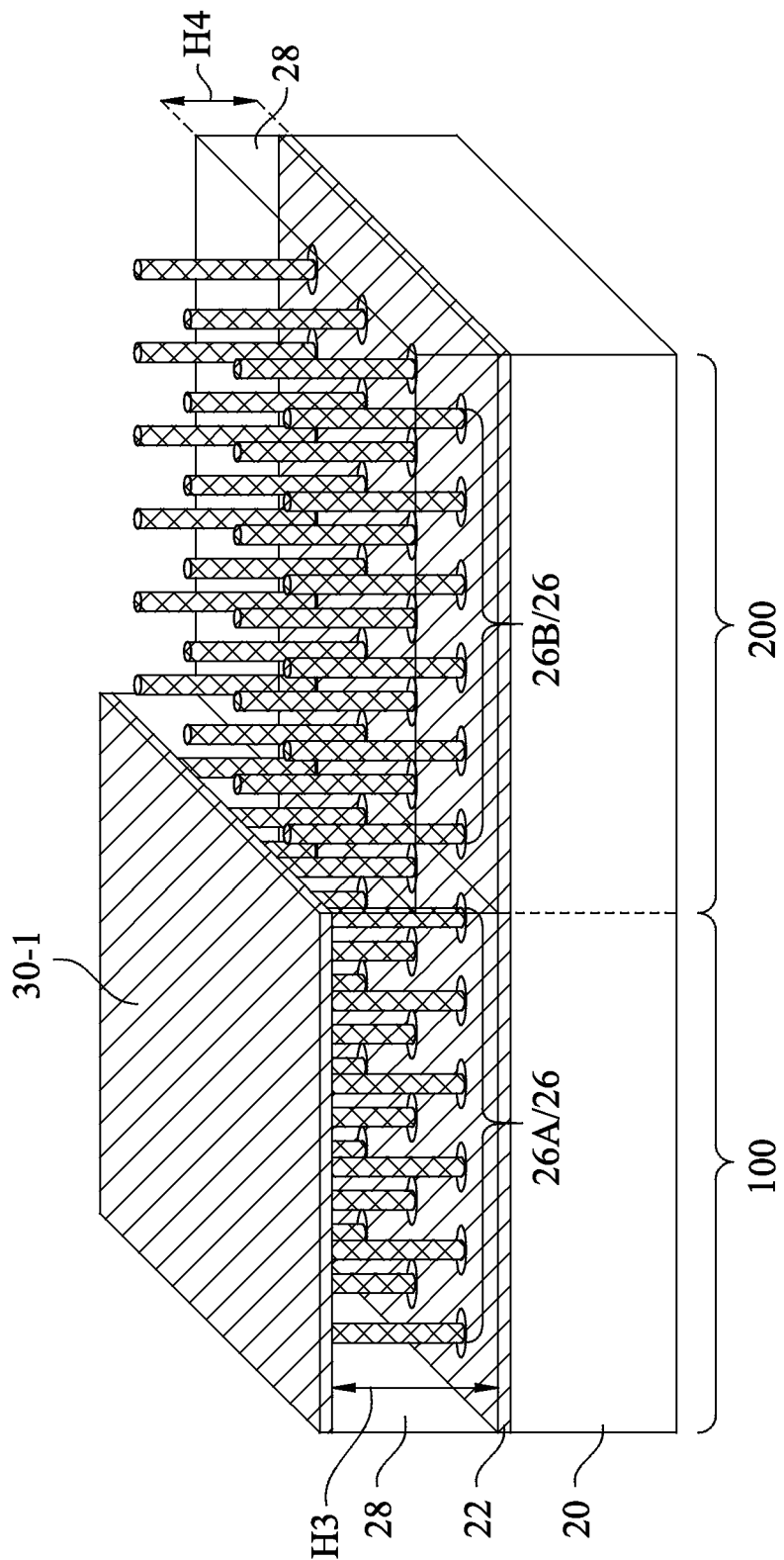

The initial steps of these embodiments are shown in FIGS. 3A through 3D, which are essentially the same as the process steps shown in FIGS. 1A through 1D. The details are thus not repeated herein. Next, as shown in FIG. 3E, the portion of sacrificial layer 28 in PMOS region 200 is recessed in an etching step from height H3 to height H4. Height H4 may be smaller than height H3 by a difference greater than about 5 nm, or greater than about 10 nm. Furthermore, ratio H4/H3 (or L2/L2) may be smaller than about 0.8 or smaller than about 0.5 in some embodiments. In the recessing, nanowires 26B may remain un-etched, and hence the top surfaces of nanowires 26B protrude over the top surface of sacrificial layer 28.

Figure 3F:
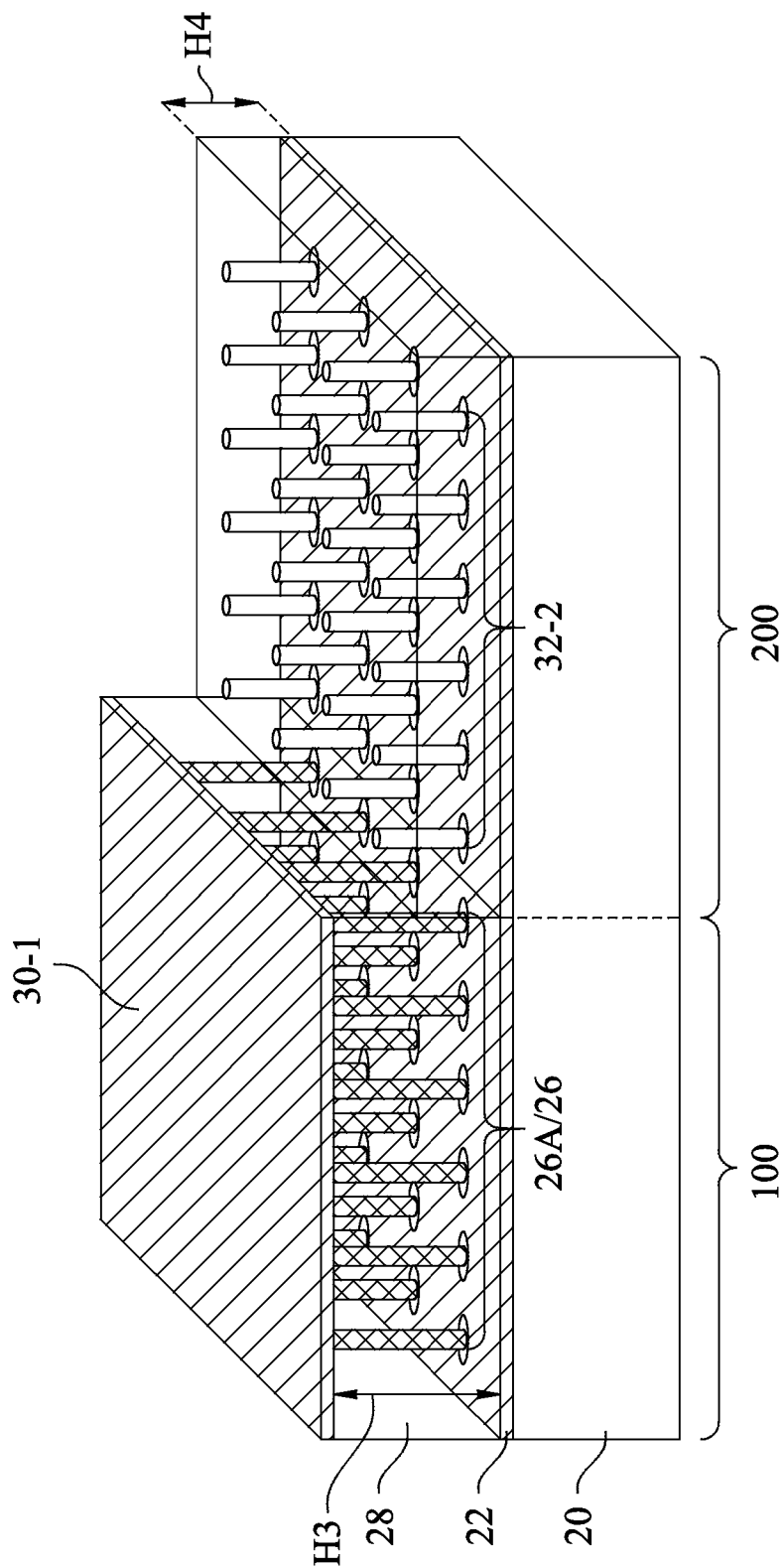
Figure 3G:
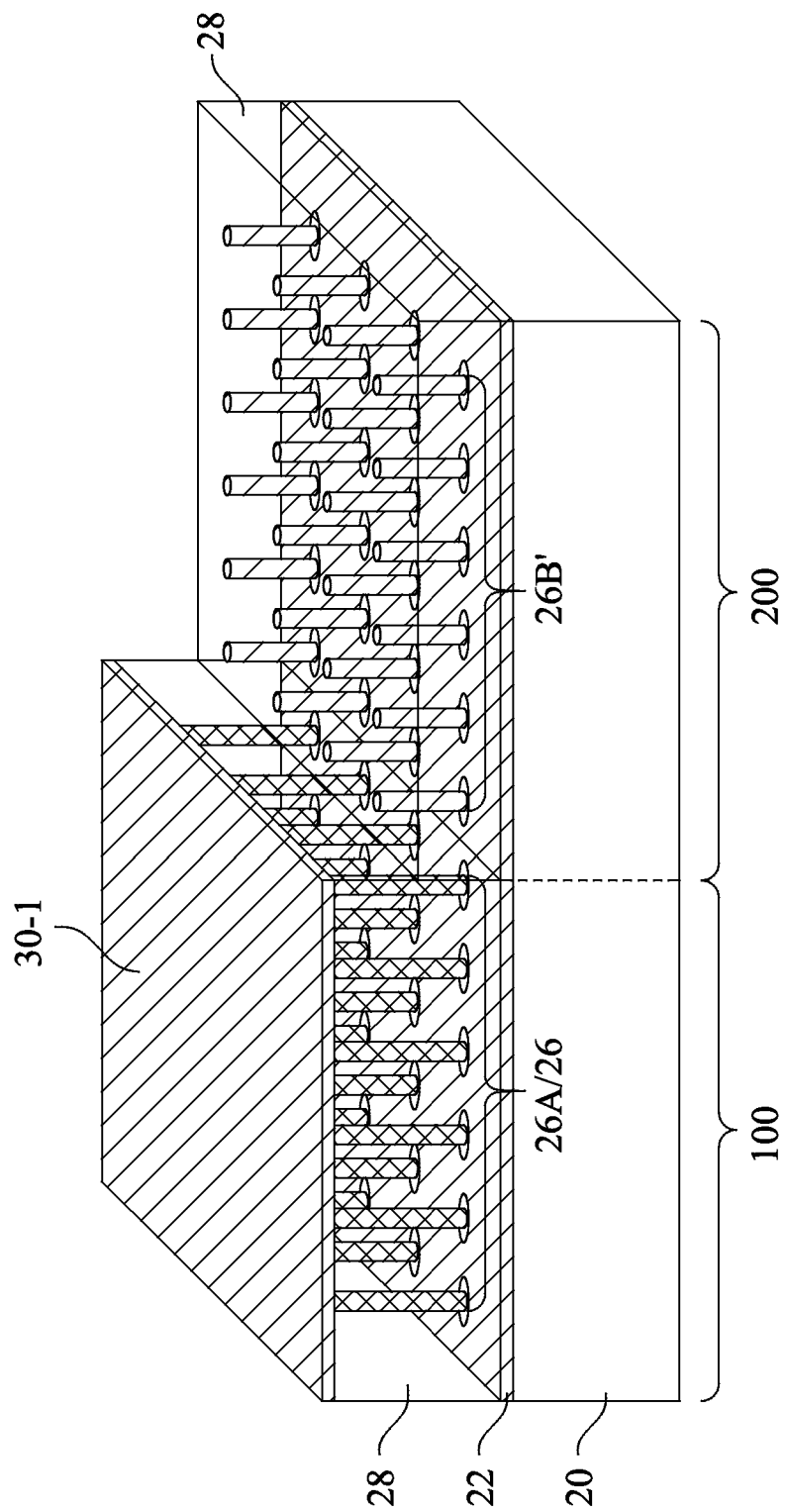
Figure 3H:
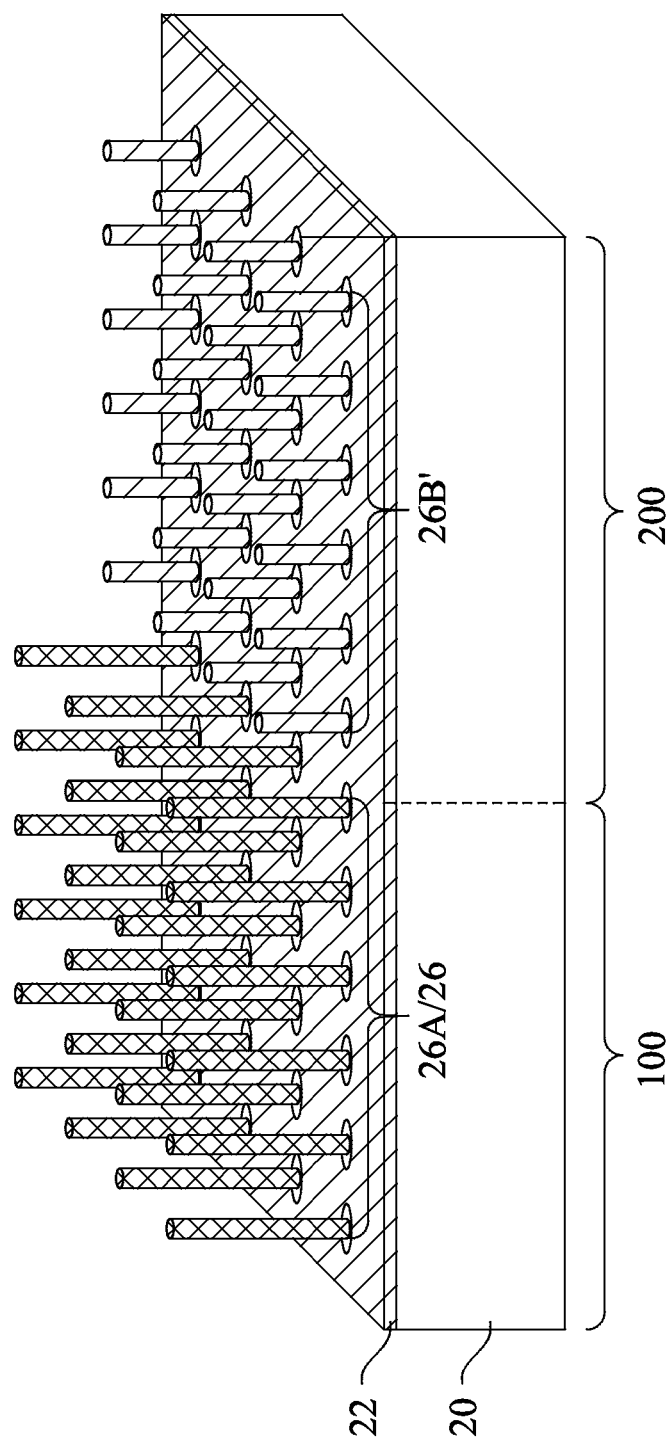

Next, nanowires 26B are etched, forming nano-openings 32-2 as shown in FIG. 3F. The height of nano-openings 32-2 is thus H4. FIG. 3G illustrates the re-growth of replacement nanowires 26B', whose height may be close to H4 in these embodiments. In subsequent steps, mask layer 30-1 and sacrificial layer 28 are removed, leaving nanowires 26A and 26B' as shown in FIG. 3H. In alternative embodiments, after the formation of nanowires 26B', the steps shown in FIGS. 1G through 1J are performed to replace nanowires 26A with nanowires 26A'.

In subsequent steps (not shown, refer to FIGS. 4I-4L as an example), additional features may be formed to continue the formation of NMOS devices and PMOS devices in device regions 100 and 200, respectively.

The process steps in FIGS. 1A through 1J, 2A through 2H, and 3A through 3H may be combined together. For example, two or more of the steps in shown in FIGS. 1G through 1I, the step shown in FIGS. 2F and 2G-1 through 2G-3, and the steps shown in FIGS. 3E and 3F may be combined in the same process in any combination and in any applicable order.

The embodiments shown in FIGS. 1A through 1J, 2A through 2H, and 3A through 3H illustrate the embodiments for forming nanowires. These embodiments may be integrated with additional steps to form functional circuits. FIGS. 4A through 4L illustrate the formation of an SRAM cell adopting the processes disclosed in the preceding embodiments. Since the details of the process steps in FIGS. 1A through 1J, 2A through 2H, and 3A through 3H have been discussed, the embodiments shown in FIGS. 4A through 4L will not discuss the details for forming nanowires.

Referring to 4A, substrate 20 is provided. Doped regions 36 (including 36A and 36B) are formed in substrate 20, for example, through implantation, diffusion, or the like. Doped regions 36 may be doped with n-type or p-type impurities. For example, doped regions 36A may be doped with an n-type impurity, and doped region 36B may be doped with a p-type impurity. In alternative embodiments, doped regions 36A and 36B are formed by recessing substrate 20, for example, using a dry etch with HCl used as an etching gas, and then re-growing doped regions 36A and 36B in the respective recesses. The regrown doped regions 36A and 36B may adopt desirable materials such as III-V compound semiconductors, and may be in-situ doped during the epitaxy.

Figure 4B:
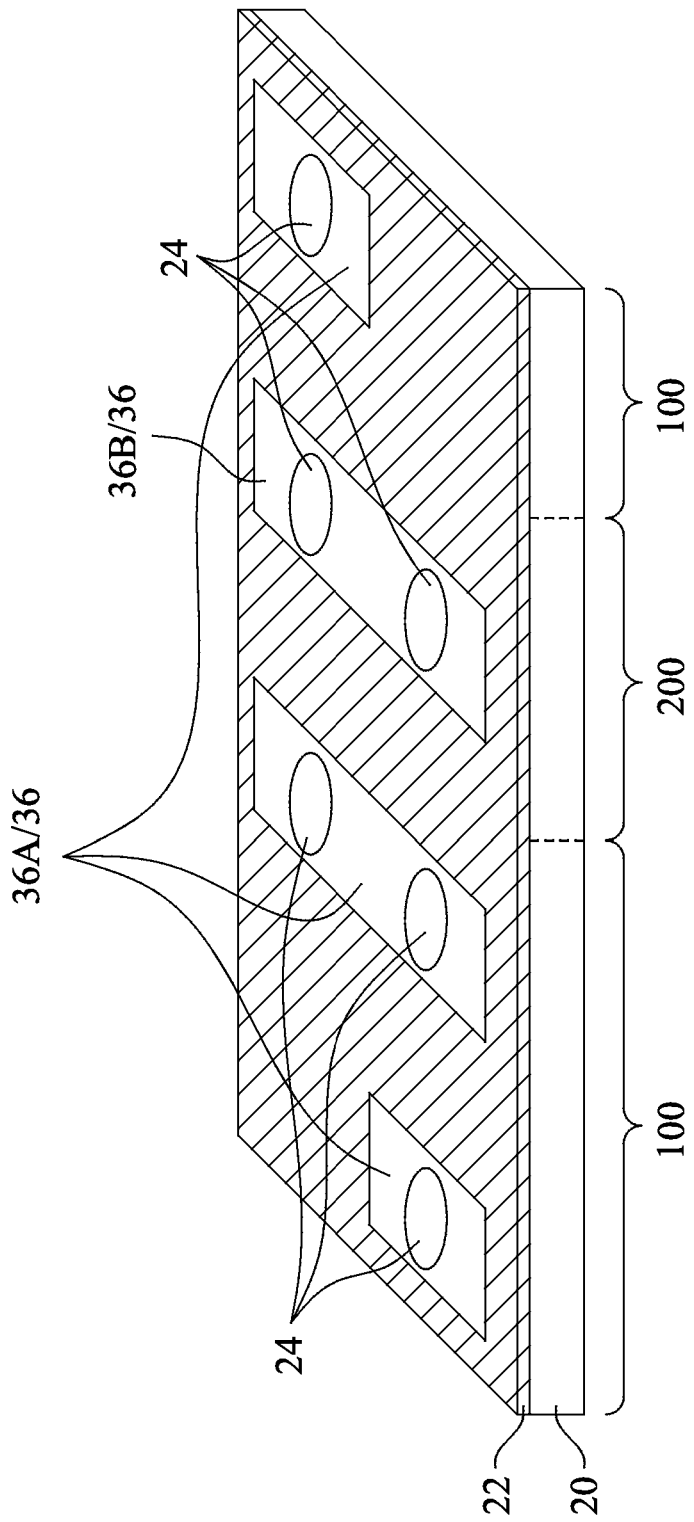
Figure 4C:
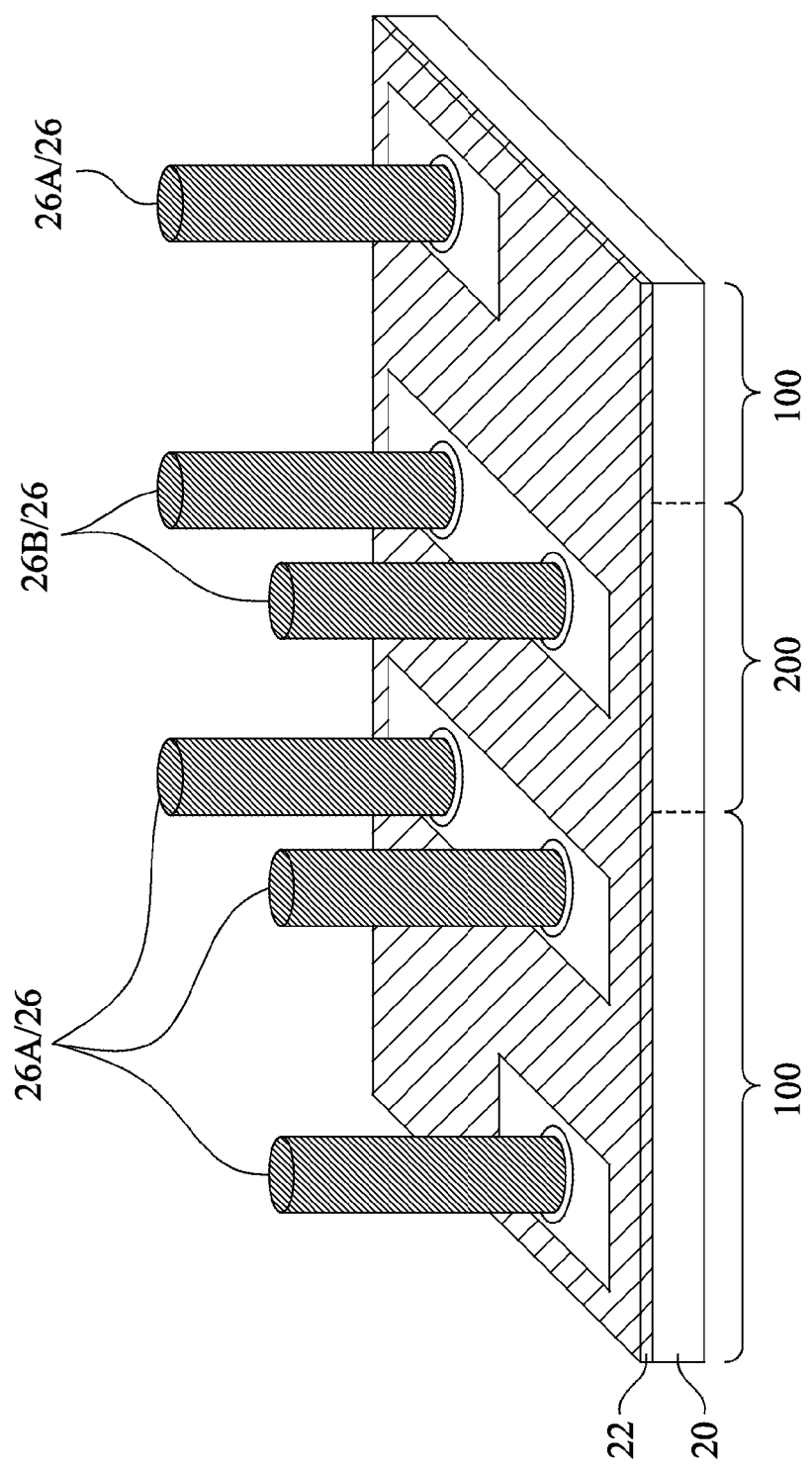
Figure 4D:
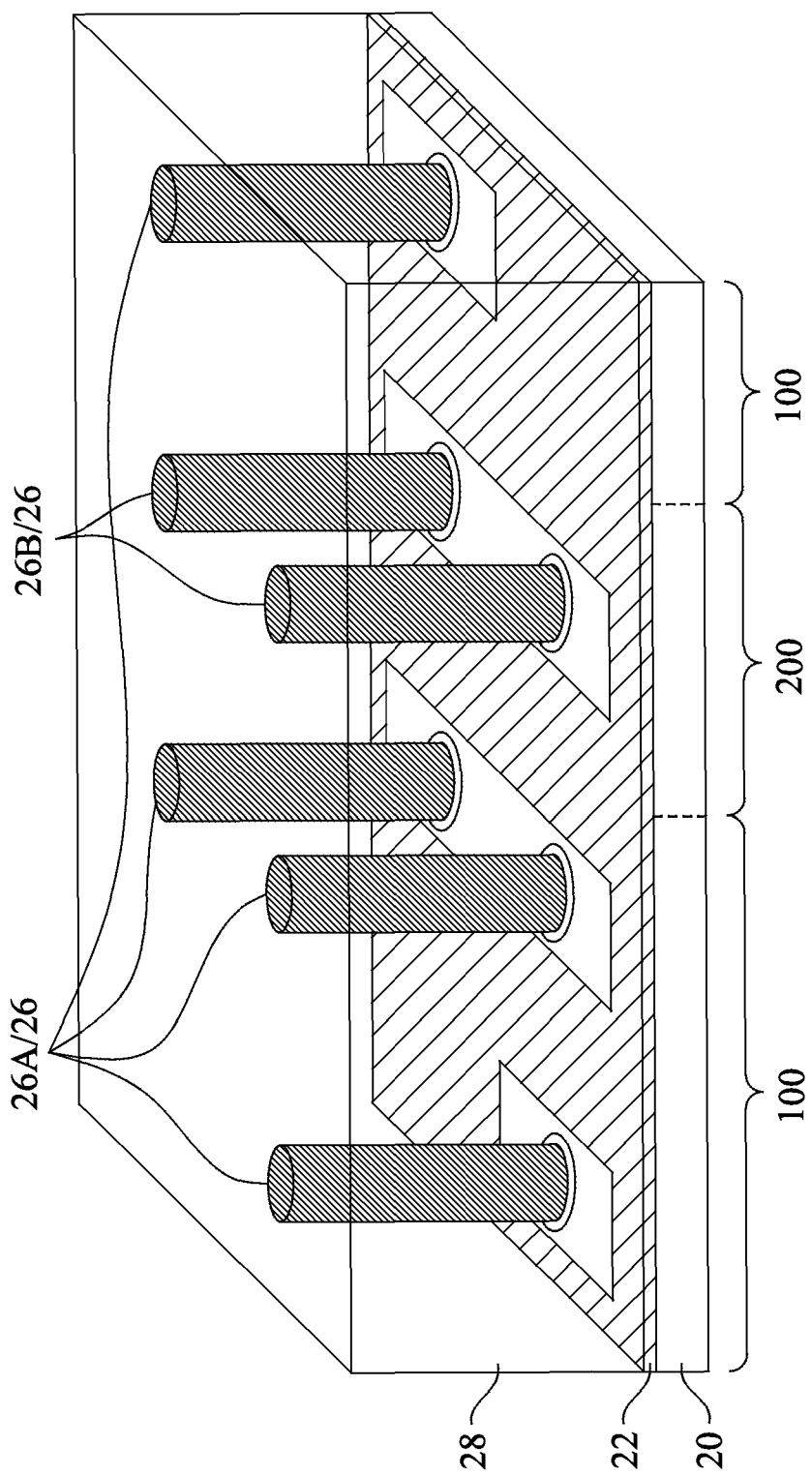

Next, referring to FIG. 4B, hard mask layer 22 is formed over substrate 20, and openings 24 are formed to expose the underlying substrate 20, wherein the exposed portions of substrate 20 may be doped regions 36. Nanowires 26 (including 26A and 26B) are then formed to protrude over hard mask layer 22, as shown in FIG. 4C. Sacrificial layer 28 is then formed, as shown in FIG. 4D, wherein a planarization such as a CMP is performed to level the top surfaces of nanowires 26 with the top surface of sacrificial layer 28.

Figure 4E:
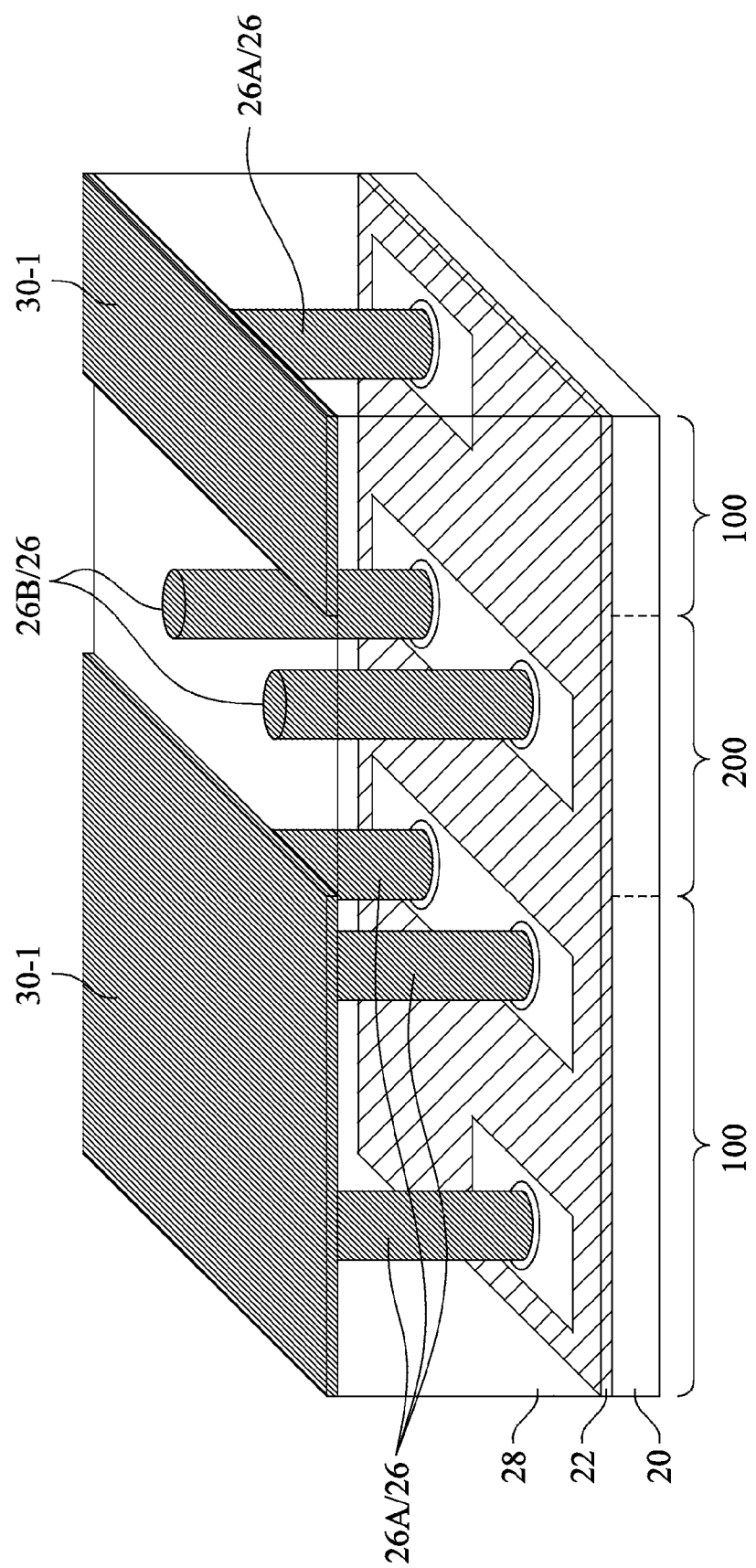
Figure 4F:
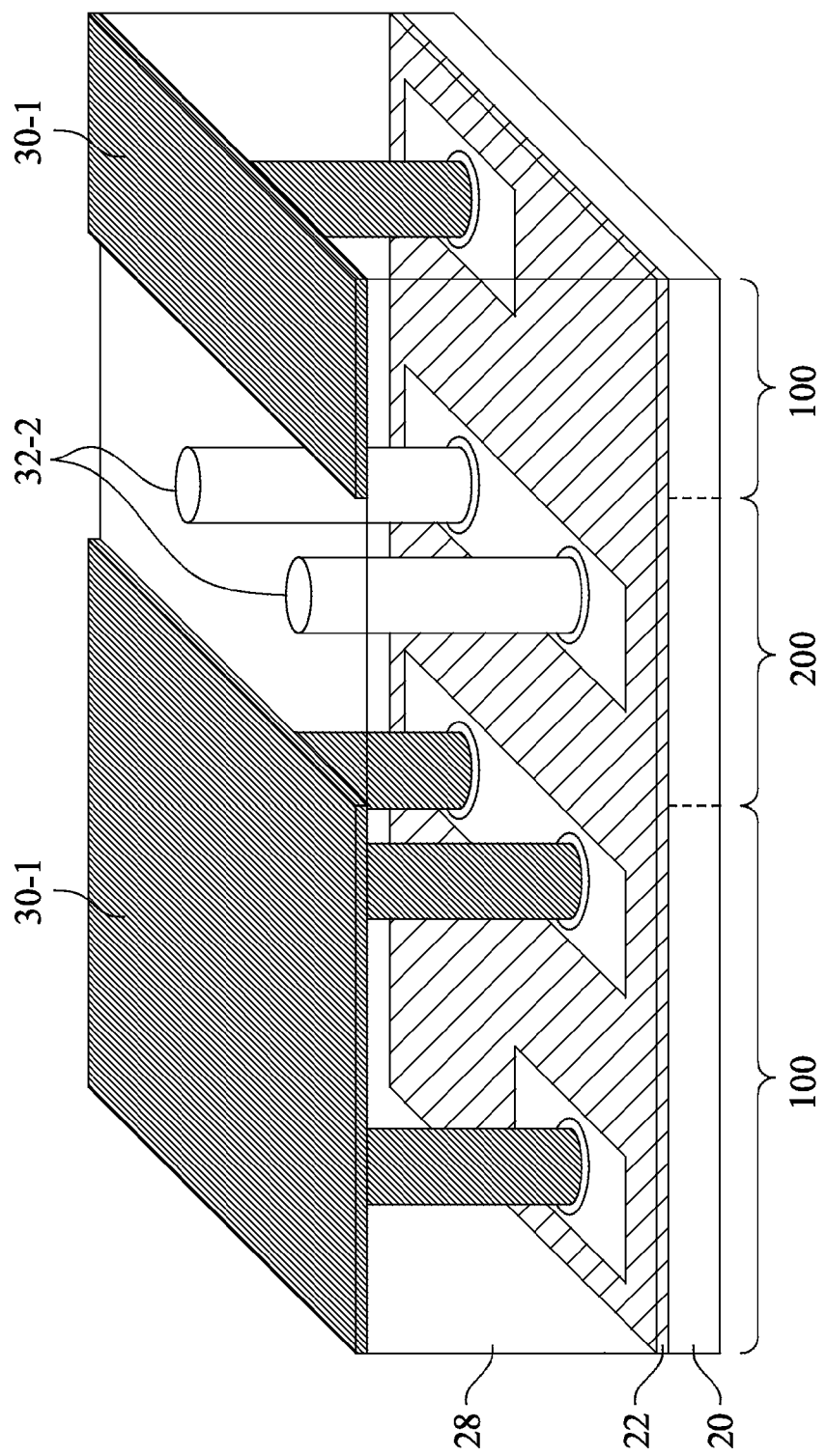
Figure 4G:
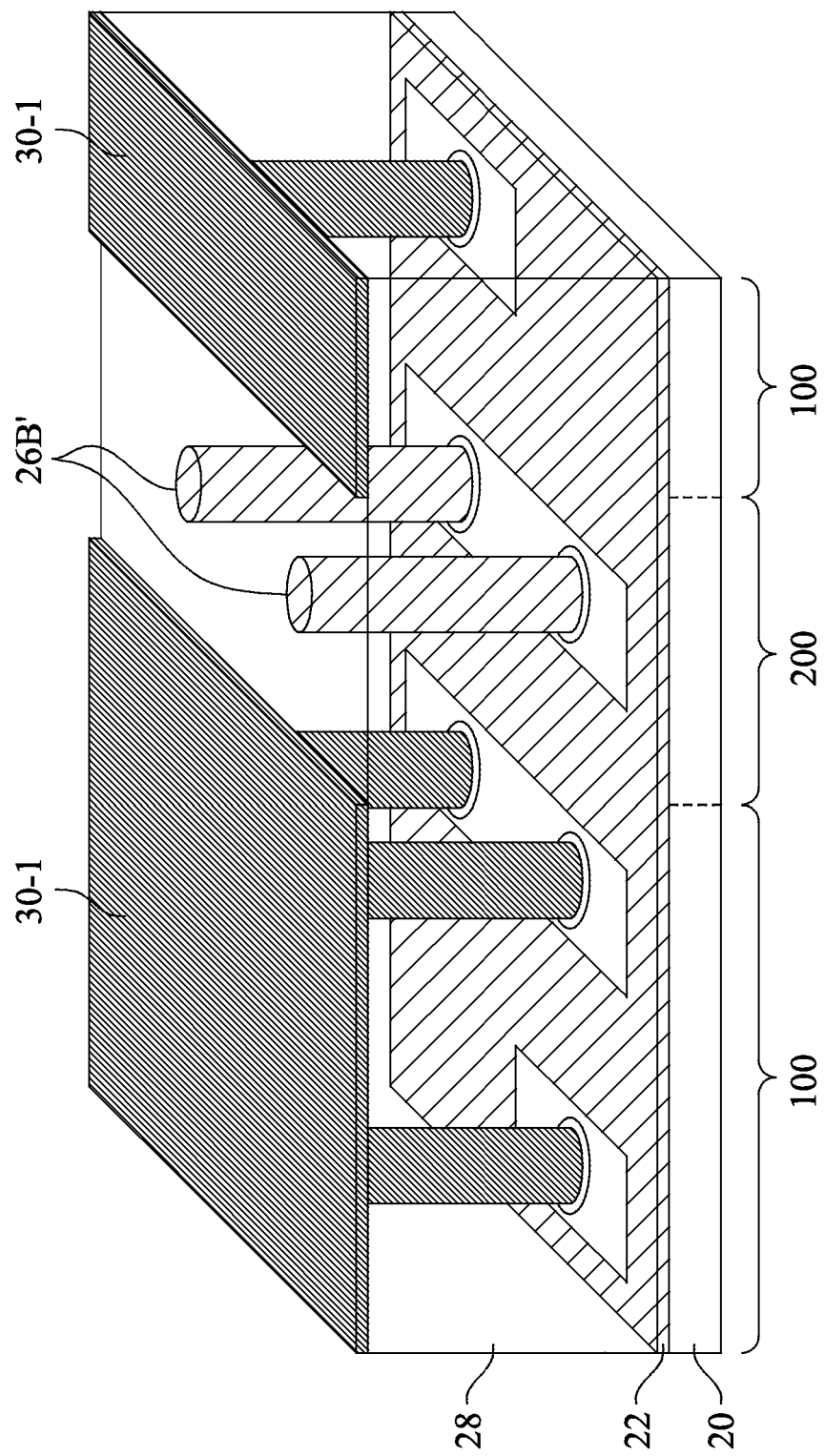

In FIG. 4E, mask layer 30-1 is formed to protect nanowires 26A, with nanowires 26B exposed. An etching step is then performed to remove nanowires 26B, forming nano-openings 32-2 in sacrificial layer 28, as shown in FIG. 4F. FIG. 4G illustrates the formation of nanowires 26B' in nano-openings 32-2.

In a subsequent step, mask layer 30-1 is removed, and the sacrificial layer 28 is recessed. The resulting structure is shown in FIG. 4H. A bottom portion of sacrificial layer 28 may be left un-etched, so that a bottom portion of each of nanowires 26A and 26B' in sacrificial layer 28 may form a bottom source/drain region of a MOS device. In alternative embodiments, sacrificial layer 28 is fully removed, while hard mask layer 22 remains. In these embodiments, the portions of doped regions 36 form the bottom source/drain regions of MOS devices.

Figure 4I:
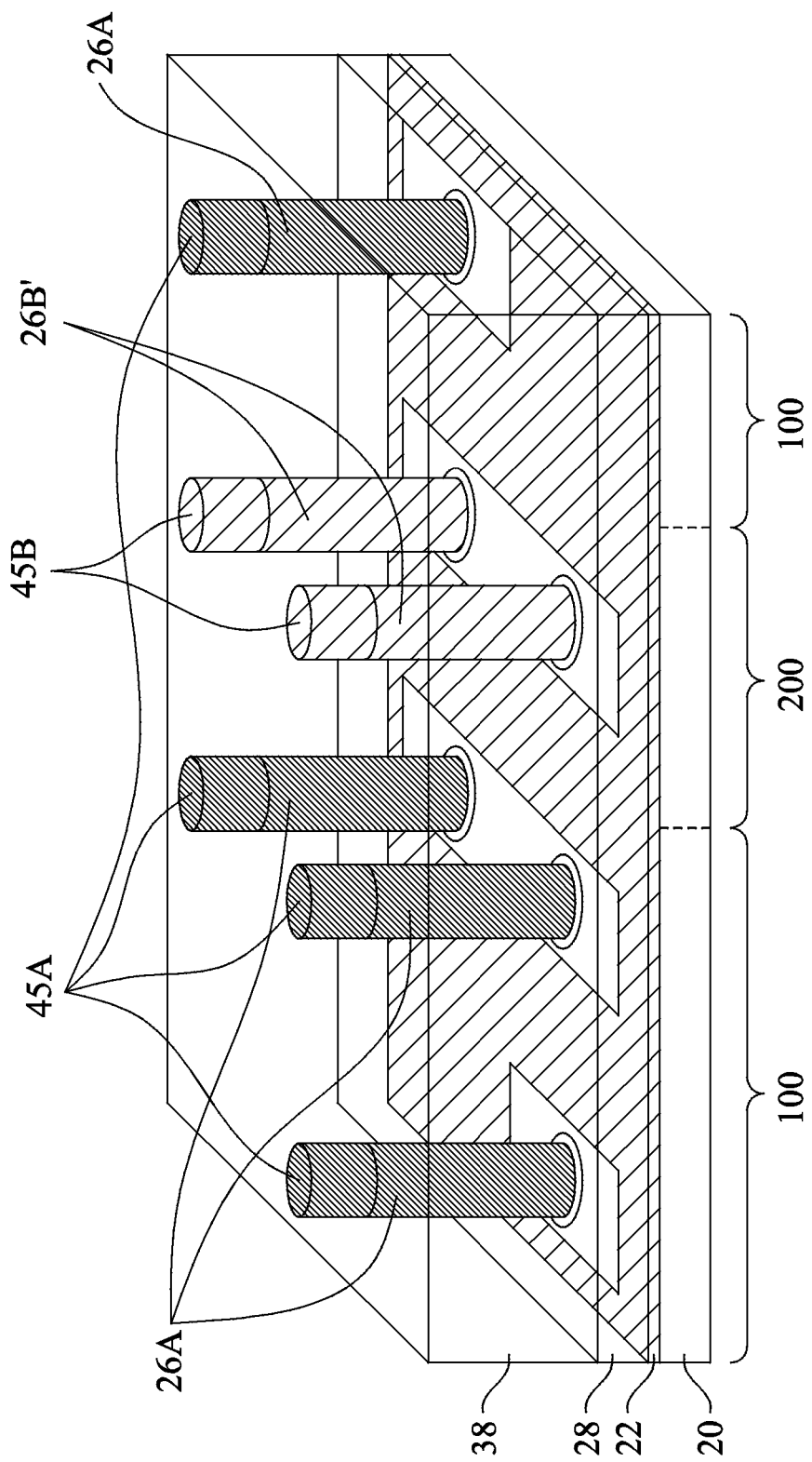

In FIG. 4I, gate stack 38 is formed, wherein the gate stack includes gate dielectrics 40 (FIG. 4N) encircling each of nanowires 26A and 26B', and gate electrodes 42 (FIG. 4N) encircling gate dielectrics 40.

Figure 4J:
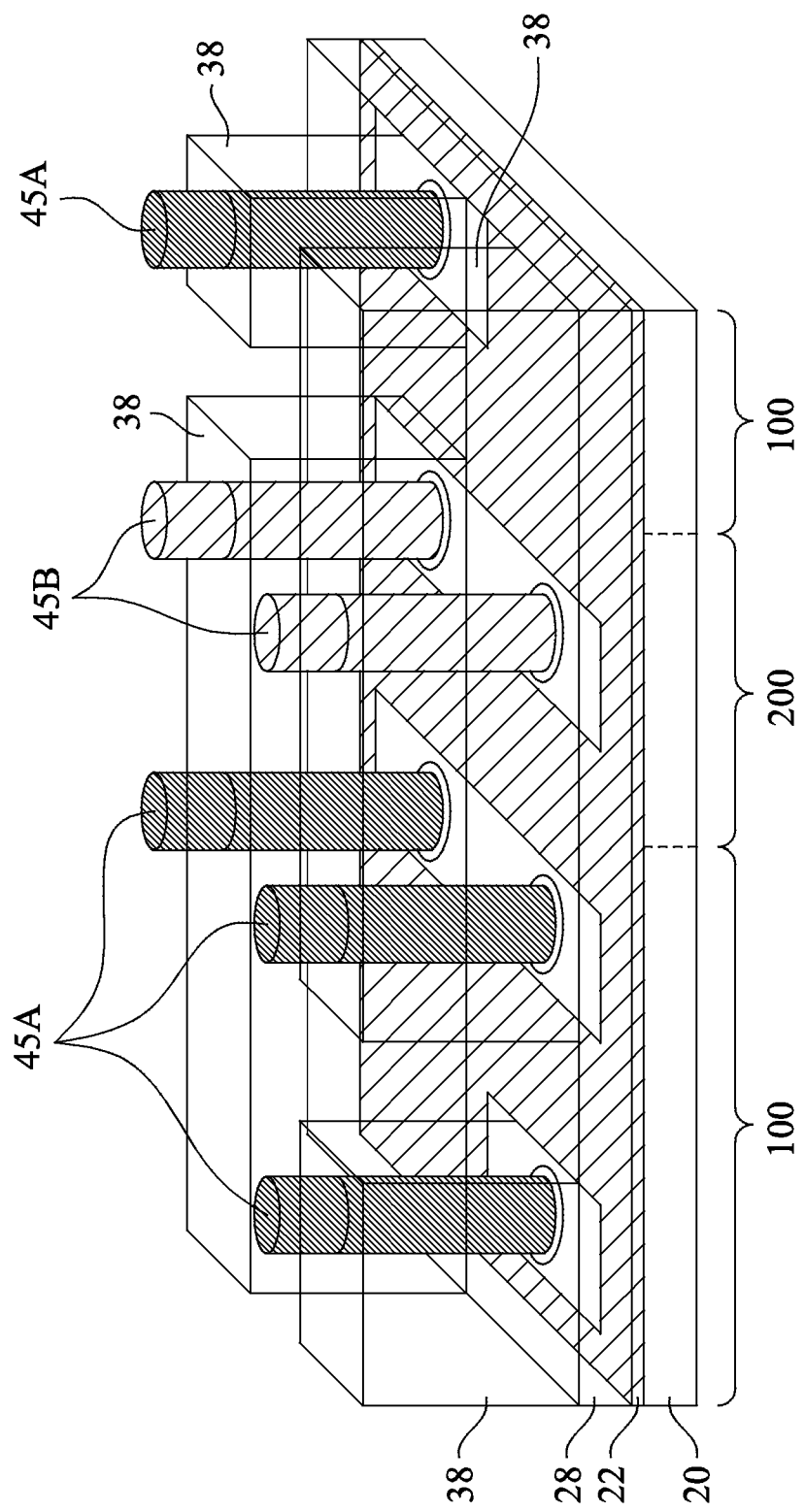

Next, gate stack 38 is patterned to form individual gate stacks 38, as shown in FIG. 4J. Furthermore, FIG. 4J illustrates the formation of top source/drain regions 45 (including 45A and 45B). Source/drain regions 45A are of n-type. Source/drain regions 45B are of p-type. Source/drain regions 45A and 45B may be formed through epitaxy in accordance with some embodiments.

Figure 4K:
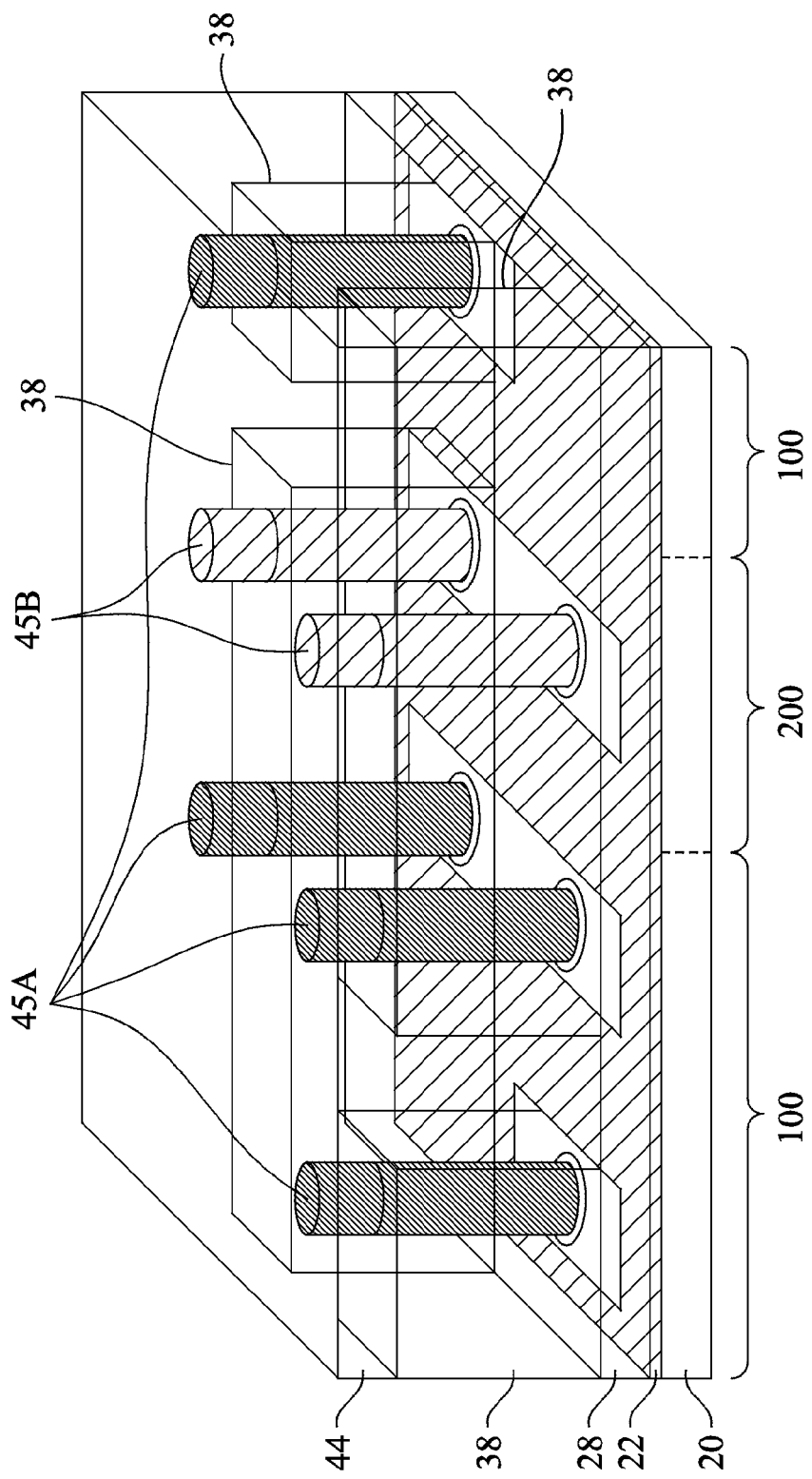
Figure 4L:
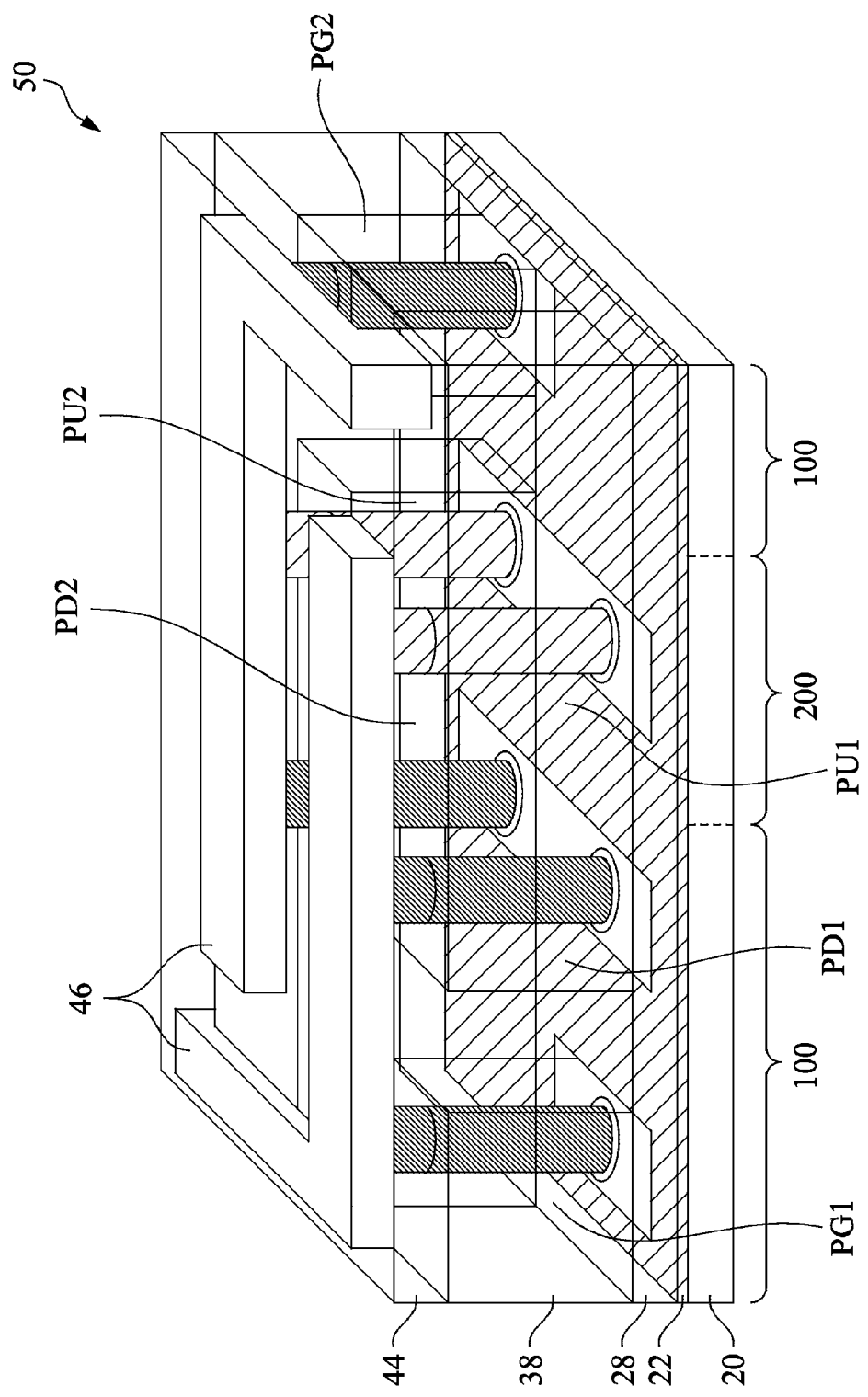

FIG. 4K illustrates the formation of dielectric layer 44, which fills the gaps between individual gate stacks 38 and source/drain regions 45A and 45B, and over gate stacks 38. Transistors PG1, PG2, PU1, PU2, PD1, and PD2 are thus formed. FIG. 4L illustrates the formation of metal lines 46 over dielectric layer 44. Metal lines 46 connect the drain regions of pull-up transistor PU1 and pull-down transistor PD1 to pass-gate transistor PG1, and connect the drain regions of pull-up transistor PU2 and pull-down transistor PD2 to pass-gate transistor PG2, so that SRAM cell 50 is formed.

Figures 4M, 4N:
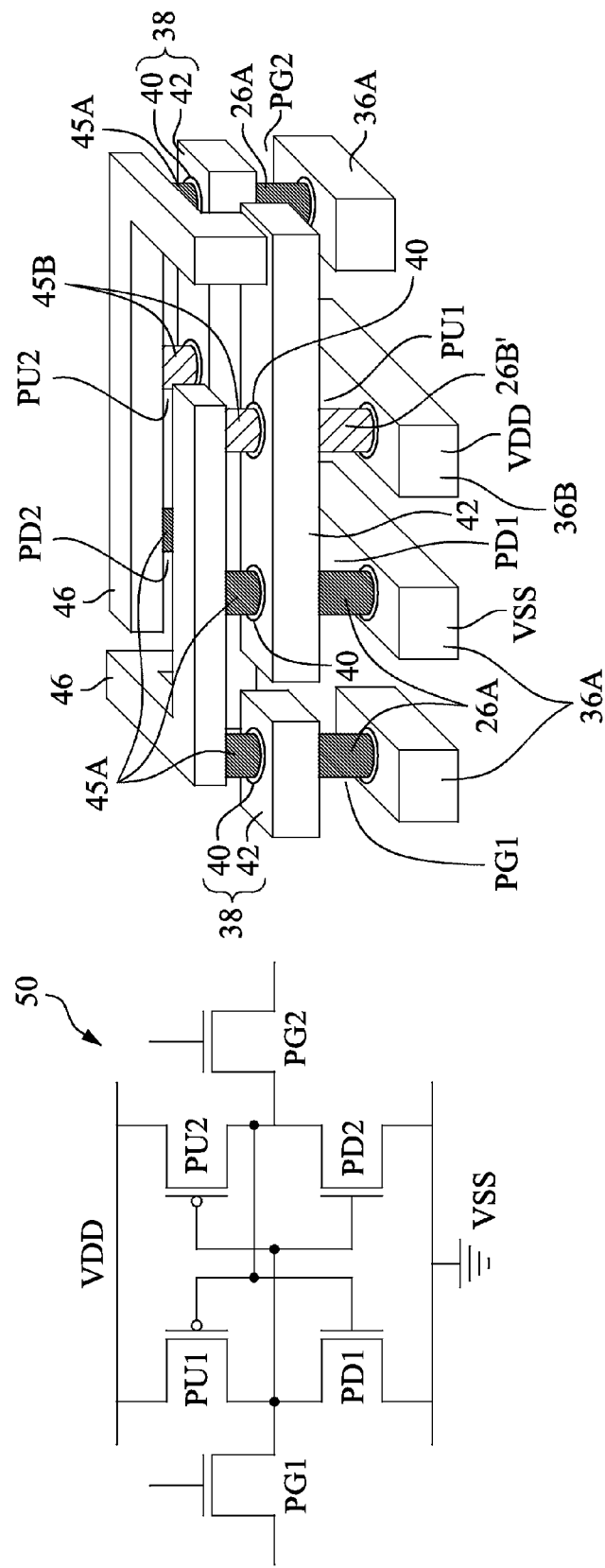
FIG. 4M illustrates a circuit diagram of an SRAM cell in accordance with some embodiments.
FIG. 4N illustrates a perspective view of an SRAM cell including nanowires in accordance with some embodiments.

FIG. 4M schematically illustrates a schematic circuit diagram of SRAM cell 50, wherein MOS devices PU1, PU2, PD1, PD2, PG1, and PG2 are illustrated. FIG. 4N illustrates a perspective view of the resulting SRAM cell 50 in accordance with some embodiments, wherein dielectric layers and substrate are not illustrated to show the internal details of SRAM cell 50. FIG. 4N illustrates that each of MOS devices PU1, PU2, PD1, PD2, PG1, and PG2 includes a nanowire surrounded by a gate dielectric 40 and a gate electrode 42, thus forming a vertical gate-all around MOS device.

The embodiments of the present disclosure have some advantageous features. By forming nanowires as templates, and using the templates to form replacement nanowires, the resulting replacement nanowires have straight and vertical profiles with smooth surfaces, which cannot be achieved by conventional nanowires formed using photo lithography. With the nanowires having smooth surfaces, the interface charge density between the replacement nanowires and the respective gate dielectrics is low, and carrier mobility is high. The shapes, the lateral dimensions, and the heights of the replacement nanowires of PMOS and NMOS devices may be adjusted freely to suit to different circuit requirements.

In accordance with some embodiments of the present disclosure, a method includes growing a nanowire from a substrate, forming a sacrificial layer surrounding the nanowire, removing the nanowire from the sacrificial layer to form an opening in the sacrificial layer, and growing a replacement semiconductor nanowire in the opening.

In accordance with alternative embodiments of the present disclosure, a method includes growing a first nanowire and a second nanowire simultaneously from a substrate, with the first nanowire and the second nanowire in a first device region and a second device region, respectively, forming a sacrificial layer having a first portion surrounding the first nanowire and a second portion encircling the second nanowire, removing the first nanowire from the sacrificial layer to form a first opening in the sacrificial layer, growing a first replacement semiconductor nanowire in the first opening, removing the second nanowire from the sacrificial layer to form a second opening in the sacrificial layer, and growing a second replacement semiconductor nanowire in the second opening. The first replacement semiconductor nanowire and the second replacement semiconductor nanowire comprise different semiconductor materials.

In accordance with yet alternative embodiments of the present disclosure, a method includes growing a III-V compound semiconductor nanowire from a silicon substrate, with the III-V compound semiconductor nanowire in contact with the silicon substrate. After the III-V compound semiconductor nanowire is grown, a sacrificial layer is formed to embed the III-V compound semiconductor nanowire therein. The method further includes performing a planarization to level a top surface of the sacrificial layer with a top surface of the III-V compound semiconductor nanowire, etching the III-V compound semiconductor nanowire to expose the top surface of the silicon substrate, and growing a replacement semiconductor nanowire in a spaced left in the sacrificial layer by the removed III-V compound semiconductor nanowire.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a hard mask layer over a top surface of a substrate, wherein the top surface of the substrate comprises a first portion and a second portion coplanar with each other;
   etching the hard mask layer to form a first opening, wherein the first portion of the top surface of the substrate is exposed through the first opening;
   growing a first nanowire from the first portion of the top surface of the substrate;
   forming a sacrificial layer surrounding the first nanowire;
   removing the first nanowire from the sacrificial layer to form a second opening in the sacrificial layer; and
   growing a second nanowire in the second opening, wherein the second nanowire comprises a semiconductor material.

2. The method of claim 1, wherein the first nanowire is grown upwardly with substantially vertical sidewalls, and the first nanowire is grown until a top surface of the first nanowire is higher than a top surface of the hard mask layer.

3. The method of claim 1 further comprising, after the removing the first nanowire and before the growing the second nanowire, performing an etching to expand a lateral dimension of the second opening.

4. The method of claim 1 further comprising, after the removing the first nanowire and before the growing the second nanowire, forming a layer on sidewalls of the second opening to reduce a lateral dimension of the second opening.

5. The method of claim 1 further comprising, before the removing the first nanowire, recessing the sacrificial layer to lower a top surface of the sacrificial layer to a level lower than a top surface of the first nanowire.

6. The method of claim 1 further comprising:
forming a gate dielectric encircling the second nanowire;
forming a gate electrode encircling the gate dielectric;
forming a first source/drain underlying the second nanowire; and
forming a second source/drain overlying the second nanowire.

7. A method comprising:
forming a patterned mask layer over a substrate, wherein the patterned mask layer comprises a first opening and a second opening in a first device region and a second device region, respectively, with a first portion and a second portion of the substrate exposed through the first opening and the second opening, respectively;
growing a first nanowire and a second nanowire simultaneously from a top surface of the substrate, wherein the first nanowire and the second nanowire are grown from the first opening and the second opening, respectively, and lateral dimensions of the first nanowire and the second nanowire are smaller than respective lateral dimensions of the first opening and the second opening, respectively;
forming a sacrificial layer comprising a first portion surrounding the first nanowire and a second portion encircling the second nanowire;
removing the first nanowire from the sacrificial layer to form a first opening in the sacrificial layer;
growing a first replacement semiconductor nanowire in the first opening;
removing the second nanowire from the sacrificial layer to form a second opening in the sacrificial layer; and
growing a second replacement semiconductor nanowire in the second opening, wherein the first replacement semiconductor nanowire and the second replacement semiconductor nanowire comprise different semiconductor materials.

8. The method of claim 7, wherein the substrate is a crystalline silicon substrate, and the first replacement semiconductor nanowire is in contact with the crystalline silicon substrate.

9. The method of claim 7, wherein the first nanowire and the second nanowire are grown upwardly, with a least a top portion of a sidewall of each of the first nanowire and the second nanowire being perpendicular to a top surface of the substrate, and wherein when the first nanowire and the second nanowire are grown, no material contacts the top portion of the sidewall.

10. The method of claim 7 further comprising, after the removing the first nanowire and before the growing the first replacement semiconductor nanowire, performing an etching to expand a lateral dimension of the first opening.

11. The method of claim 7 further comprising, after the removing the first nanowire and before the growing the first replacement semiconductor nanowire, forming a layer on sidewalls of the first opening to reduce a lateral dimension of the first opening.

12. A method comprising:
growing a III-V compound semiconductor nanowire from a silicon substrate, with the III-V compound semiconductor nanowire in contact with the silicon substrate;
after the III-V compound semiconductor nanowire is grown, forming a sacrificial layer to embed the III-V compound semiconductor nanowire therein;
performing a planarization to level a top surface of the sacrificial layer with a top surface of the III-V compound semiconductor nanowire;
etching the sacrificial layer to lower the planarized top surface of the sacrificial layer to a level lower than the top surface of the III-V compound semiconductor nanowire;
etching the III-V compound semiconductor nanowire to expose the top surface of the silicon substrate; and
growing a replacement semiconductor nanowire in a spaced left in the sacrificial layer by the removed III-V compound semiconductor nanowire.

13. The method of claim 12, wherein after the etching the III-V compound semiconductor nanowire, the III-V compound semiconductor nanowire is removed fully.

14. The method of claim 12, wherein the replacement semiconductor nanowire comprises an additional III-V compound semiconductor material.

15. The method of claim 12, wherein the replacement semiconductor nanowire comprises $Si_xGe_{1-x}$, with x being between and including 0 and 1.

16. The method of claim 12, wherein before the etching the III-V compound semiconductor nanowire, no additional etching step is performed to reduce a lateral dimension of the III-V compound semiconductor nanowire.

17. The method of claim 12 further comprising:
forming a gate dielectric encircling the replacement semiconductor nanowire;
forming a gate electrode encircling the gate dielectric;
forming a first source/drain underlying the replacement semiconductor nanowire; and
forming a second source/drain overlying the replacement semiconductor nanowire.

18. The method of claim 1 further comprising:
performing a planarization to level a top surface of the sacrificial layer with a top surface of the first nanowire; and
etching the sacrificial layer to lower the planarized top surface of the sacrificial layer to a level lower than the top surface of the first nanowire.

19. The method of claim 7, wherein after the first nanowire and the second nanowire are grown, a portion of the top surface of the substrate remains to be exposed to the first opening, and the portion of the top surface forms a ring surrounding the first nanowire in a top view of the substrate.

20. The method of claim 1, wherein the first portion of the top surface of the substrate has a center portion and an outer portion encircling the center portion, and the first nanowire is grown from the center portion, with the center portion remaining to be exposed after the first nanowire is grown.

* * * * *